United States Patent
Park et al.

(10) Patent No.: US 11,347,342 B2
(45) Date of Patent: May 31, 2022

(54) CONDUCTIVE BONDING STRUCTURE FOR SUBSTRATES AND DISPLAY DEVICE INCLUDING THE SAME

(71) Applicant: Samsung Display Co., LTD., Yongin-si (KR)

(72) Inventors: Seong-Sik Park, Seoul (KR); Gyutae Kim, Seoul (KR); San Park, Incheon (KR); Sung Soo Lee, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/366,246

(22) Filed: Jul. 2, 2021

(65) Prior Publication Data

US 2022/0137739 A1 May 5, 2022

(30) Foreign Application Priority Data

Nov. 4, 2020 (KR) ........................ 10-2020-0146330

(51) Int. Cl.
*G06F 3/041* (2006.01)
*G06F 1/18* (2006.01)
*H05K 1/18* (2006.01)

(52) U.S. Cl.
CPC ............ *G06F 3/0412* (2013.01); *G06F 1/189* (2013.01); *G06F 3/04164* (2019.05); *H05K 1/181* (2013.01); *H05K 2201/0939* (2013.01); *H05K 2201/10128* (2013.01)

(58) Field of Classification Search
None
See application file for complete search history.

(56) References Cited

U.S. PATENT DOCUMENTS

| 7,078,726 | B2 | 7/2006 | Pichler et al. | |
|---|---|---|---|---|
| 2010/0237483 | A1* | 9/2010 | Chi | H01L 23/13 |
| | | | | 257/686 |
| 2020/0258841 | A1* | 8/2020 | Kim | H01L 23/367 |
| 2020/0271979 | A1* | 8/2020 | Roh | H01L 24/05 |

FOREIGN PATENT DOCUMENTS

| CN | 1849717 A | 10/2006 |
|---|---|---|
| EP | 03003672 A1 | 4/2016 |
| JP | 3431003 B2 | 5/2003 |
| KR | 10-1753501 B1 | 7/2017 |
| KR | 1020180127705 A | 11/2018 |

* cited by examiner

*Primary Examiner* — Krishna P Neupane
(74) *Attorney, Agent, or Firm* — Cantor Colburn LLP

(57) ABSTRACT

A substrate conductive bonding structure includes a lower substrate including a connection pad exposed to outside the lower substrate, an upper substrate including a transfer pad overlapping the connection pad, exposed to outside the upper substrate and including an upper surface, and a slit defined in the transfer pad, overlapping the connection pad and open at the upper surface of the transfer pad, the slit including an extending portion extending along a first direction and having a first slit width along a second direction crossing the first direction, and an expansion portion connected to the extending portion and having a second slit width along the second direction which is larger than the first slit width, and a solder contacting the upper surface of the connection pad, extending to the upper surface of the transfer pad and into the slit.

20 Claims, 21 Drawing Sheets

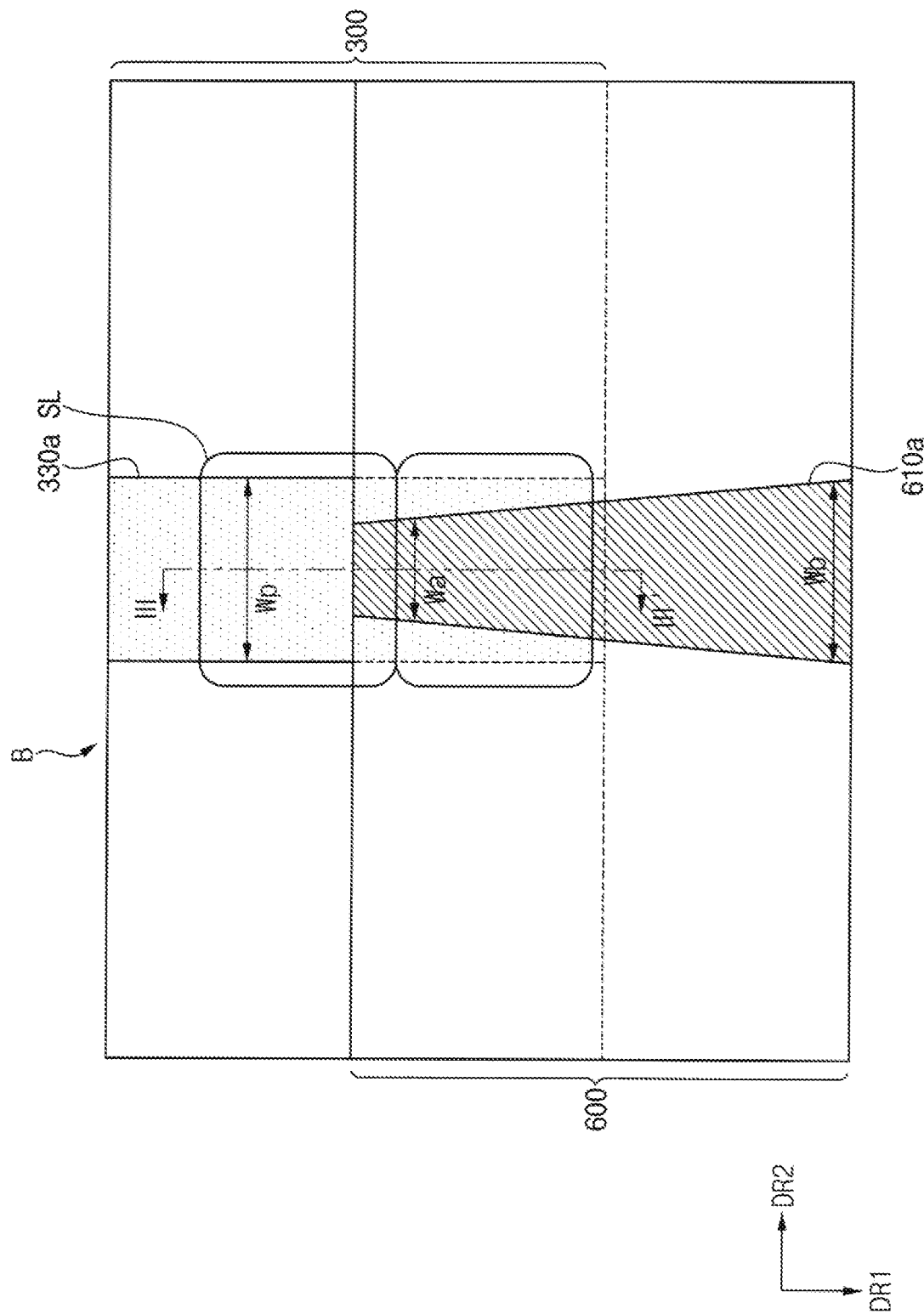

CONDUCTIVE BONDING STRUCTURE FOR SUBSTRATES AND DISPLAY DEVICE INCLUDING THE SAME

This application claims priority to Korean Patent Application No. 10-2020-0146330 filed on Nov. 4, 2020, and all the benefits accruing therefrom under 35 U.S.C. § 119, the entire disclosure of which is incorporated by reference herein.

BACKGROUND

1. Field

Embodiments relate to a conductive bonding structure for substrates. More particularly, embodiments relate to a conductive bonding structure for substrates and a display device including the conductive bonding structure.

2. Description of the Related Art

A display device displays an image for presenting information in a visual form. The display device is used in a variety of devices such as a smartphone, etc. The display device may include at least one of a touch sensing layer for sensing a touch by a user and a digitizer for sensing a touch by a stylus pen as an input device. As the display device has various functions, the display device may include a sensor such as a fingerprint recognition sensor, an iris recognition sensor, a proximity sensor, etc.

The digitizer may be applied to a display device in various methods, such as an electromagnetic resonance ("EMR") method, a pressure sensitive method, a capacitance method, etc. In the electromagnetic resonance method, since the position information is recognized by the electromagnetic resonance between the stylus pen and an electrode pattern of the digitizer, regardless of the touch by the hand of the user, the user may use the display device more comfortably.

The digitizer and the sensor may be disposed behind or under a display panel in the display device. Accordingly, an opening may be provided in a part of the digitizer, and the sensor may be disposed in the opening. To connect wirings of the digitizer that are disconnected by the opening, the display device may include a printed circuit substrate disposed on the opening and covering the sensor. The digitizer may be electrically connected to the printed circuit substrate through a solder.

SUMMARY

Embodiments provide a conductive bonding structure for circuit substrates with improved reliability.

Embodiments provide a display device including the conductive bonding structure.

An embodiment of a conductive bonding structure for substrates includes a lower substrate including a connection pad, an upper substrate including a transfer pad partially overlapping the connection pad, and a solder contacting an upper surface of the connection pad and an upper surface of the transfer pad. The transfer pad includes a slit overlapping the connection pad and receiving at least a portion of the solder. The slit includes an extending portion which extends along a first direction, and an expansion portion which is connected to the extending portion and has a width larger than a width of the extending portion.

In an embodiment, the expansion portion may have a circular shape.

In an embodiment, the expansion portion may have a polygonal shape.

In an embodiment, the slit may include a plurality of expansion portions.

In an embodiment, the extending portion may be spaced apart from an outer end of the transfer pad.

In an embodiment, the upper substrate may further include a supporting substrate disposed under the transfer pad, and a lower contact pad disposed under the supporting substrate.

In an embodiment, the slit may pass through the transfer pad and the supporting substrate. The solder may pass through the slit to contact the lower contact pad.

In an embodiment, the solder may pass through the slit to contact an upper surface of the supporting substrate.

An embodiment of a conductive bonding structure for substrates includes a lower substrate including a connection pad, an upper substrate including a transfer pad partially overlapping the connection pad, and a solder contacting an upper surface of the connection pad and an upper surface of the transfer pad. The transfer pad has a tapered shape in a plan view such that a width of a distal end of the transfer pad is smaller than a width of the connection pad.

An embodiment of a display device includes a display panel, a digitizer disposed under the display panel and including an opening, a sensor disposed in the opening, a connection substrate covering the sensor and electrically connected to the digitizer, and a solder bonding the digitizer and the connection substrate to each other. The digitizer includes a first wiring extending along a first direction and a first connection pad electrically connected to the first wiring. The connection substrate includes a first transfer pad including a slit which overlaps the first connection pad of the digitizer and receives at least a portion of the solder. The slit includes an extending portion which extends along the first direction, and an expansion portion which is connected to the extending portion and has a width larger than a width of the extending portion.

According to embodiments, bonding reliability and alignment reliability may be improved when substrates are bonded to each other to manufacture an electronic device.

BRIEF DESCRIPTION OF THE DRAWINGS

Illustrative, non-limiting embodiments will be more clearly understood from the following detailed description taken in conjunction with the accompanying drawings.

FIG. 5 is an enlarged plan view illustrating region 'B' of FIG. 4A.

DETAILED DESCRIPTION

Figure 1:
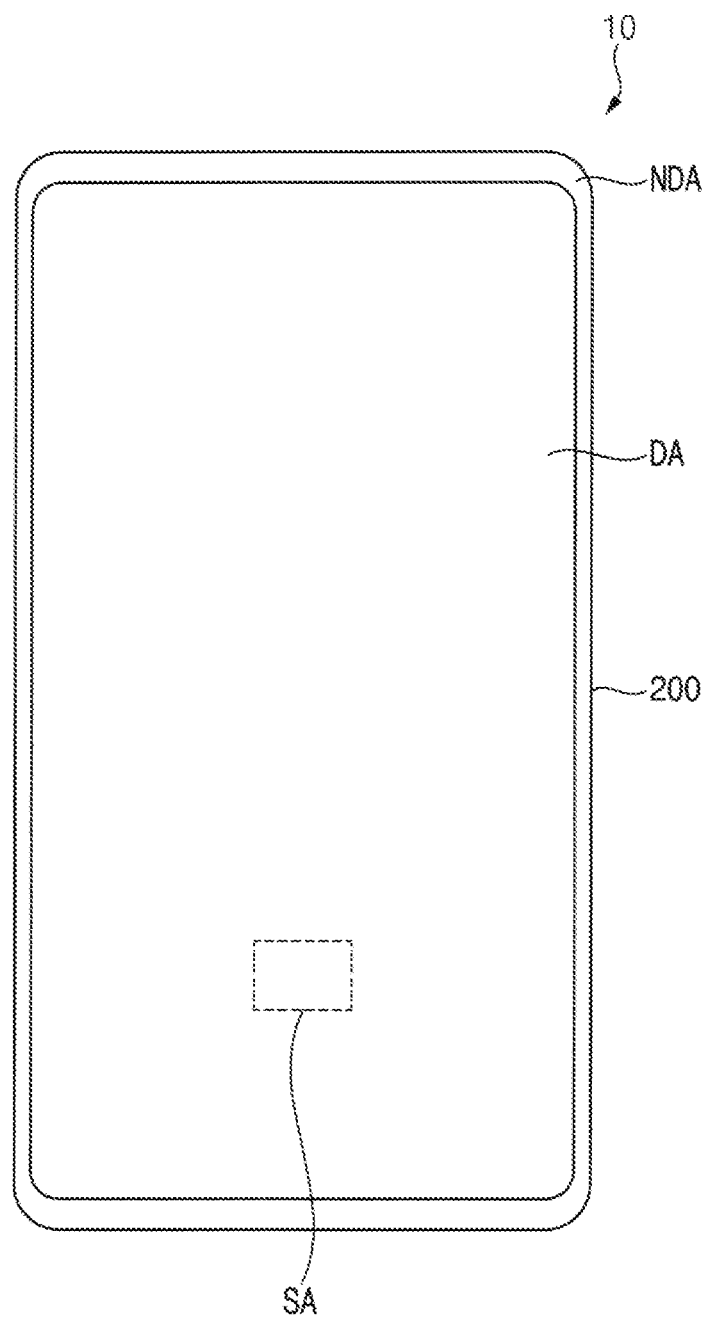
FIG. 1 is a plan view illustrating an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of bonding structures and display devices will be explained in detail with reference to the accompanying drawings.

FIG. 1 is a plan view illustrating an embodiment of a display device 10.

Referring to FIG. 1, a display device 10 may include a display area DA and a non-display area NDA. The display area DA may display an image. The display area DA may have a rectangular shape having a round corner as illustrated in FIG. 1 or having a sharp corner. However, embodiments are not limited thereto. In an embodiment, for example, the display area DA may have various planar shapes such as a circular shape, an oval shape, a polygonal shape or the like.

The display area DA may include a sensing area SA. The sensing area SA may recognize various information input to the display device 10 such as from a user or input tool. In an embodiment, the sensing area SA may recognize a fingerprint of a user. The sensing area SA may have a rectangular shape as illustrated in FIG. 1. However, embodiments are not limited thereto. In an embodiment, for example, the sensing area SA may have various planar shapes such as a circular shape, an oval shape, a polygonal shape or the like.

The non-display area NDA may be a planar area that is adjacent to the display area DA and does not display an image. In an embodiment, for example, the non-display area NDA may surround the display area DA. In an embodiment, drivers that provide electrical signals to the display area DA may be disposed in the non-display area NDA.

Figure 2A:
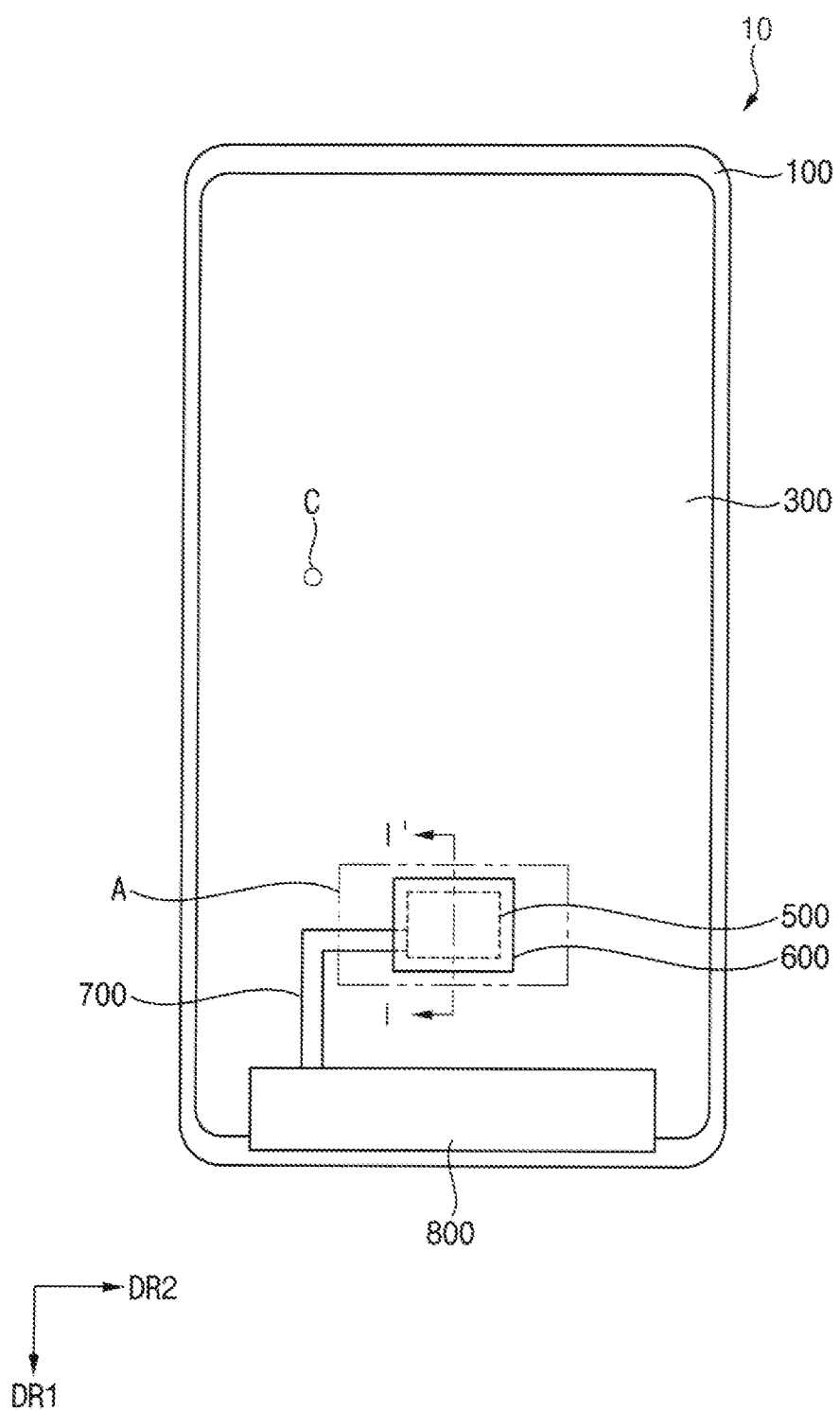
FIGS. 2A and 2B are rear views illustrating an embodiment of the display device in FIG. 1.
Figure 2B:
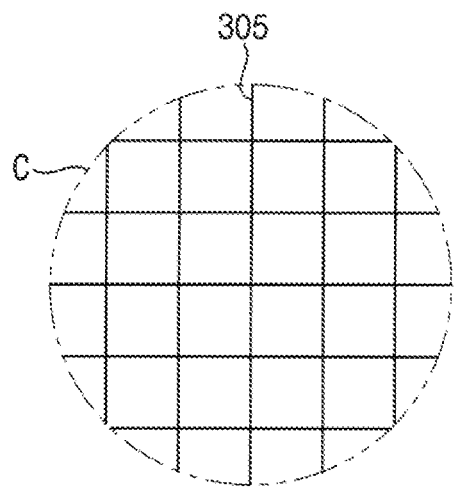
Figure 3:
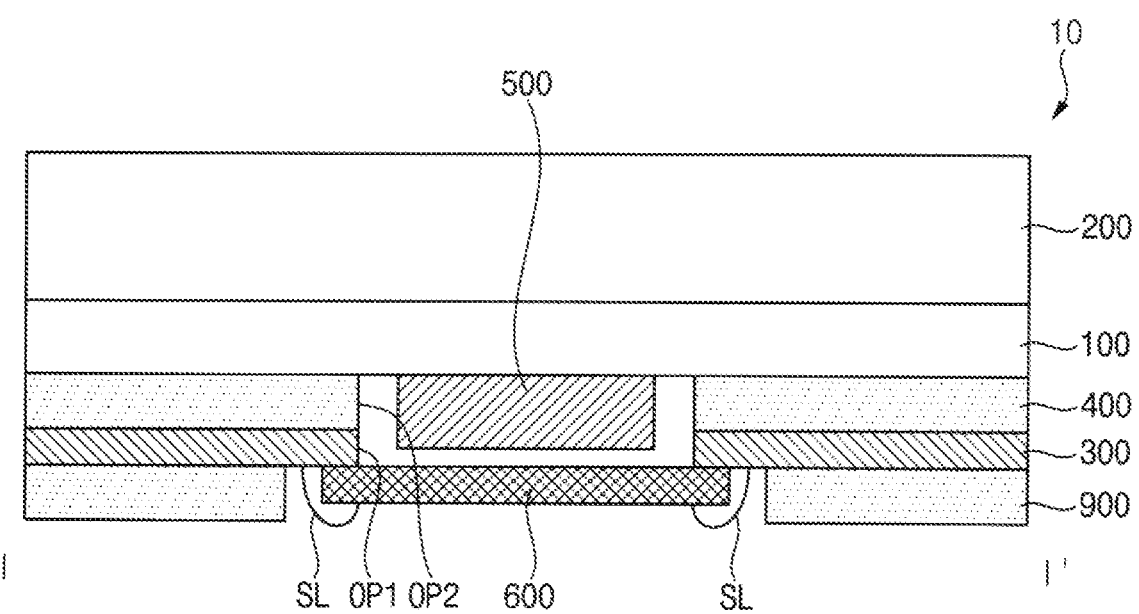
FIG. 3 is a cross-sectional view taken along line I-I' in FIG. 2A.

FIG. 2A is a rear view illustrating an embodiment of the display device 10 in FIG. 1 and FIG. 2B is an enlarged view of region 'C' of FIG. 2A. FIG. 3 is a cross-sectional view taken along line I-I' in FIG. 2A.

Referring to FIGS. 1, 2 and 3, a display device 10 may include a display panel 100, a protective window 200, a digitizer 300, a cushion layer 400, a sensor 500, a first circuit substrate 600, a second circuit substrate 700, a driving substrate 800 and a heat dissipation layer 900.

The display panel 100 may generate and/or display an image. The display panel 100 may include a driving element and a display element which are each disposed on a base substrate.

In an embodiment, for example, the driving element may include a transistor, a capacitor, a wiring, or the like.

The base substrate may be a rigid substrate including a glass or the like, or a flexible substrate including polyimide or the like. In an embodiment, the substrate is a flexible substrate so that the display panel 100 may be bendable, foldable and/or rollable.

In an embodiment, for example, the display element may include a light-emitting element that generates a light. In an embodiment, the light-emitting element may be an organic light-emitting element.

The protective window 200 may be disposed on the display panel 100. The protective window 200 may protect the display panel 100 and may transmit light emitted from the display panel 100 to outside the display device 10. Accordingly, the display device 10 may provide an image generated by the display panel 100 to outside the display device 10 through the protective window 200. The protective window 200 may include a glass or a plastic such as polyimide, polyethylene terephthalate, polyvinyl resin, polyester or the like.

The protective window 200 may overlap the display panel 100, and may be disposed to cover an upper surface of the display panel 100. The protective window 200 may include a black matrix disposed along an edge of a lower surface of the protective window 200. The black matrix may reduce or effectively prevent recognition through the protective window 200 of elements disposed under the protective window 200.

Even though not illustrated in FIG. 3, at least one of an input sensing layer and an anti-reflection layer may be disposed between the display panel 100 and the protective window 200. In an embodiment, the input sensing layer and the anti-reflection layer may be disposed to cover an upper surface (e.g., front surface) of the display panel 100. The input sensing layer and the anti-reflection layer may be combined to the display panel 100 and protective window 200 by an optically clear adhesive ("OCA"), an optically clear resin ("OCR") or the like.

The digitizer 300 may be disposed under the display panel 100. The digitizer 300 may recognize positional information of an input device incident to the upper surface of the display device 10. Thus, the digitizer 300 may provide an input function of the display device 10.

The digitizer 300 may be disposed on a lower surface of the display panel 100. The digitizer 300 may recognize movement or position of an input device (e.g., a stylus pen) on the upper surface of the display device 10, and may convert the movement or the position into a digital signal.

The digitizer 300 may include a wiring 305 provided in plural including a plurality of wirings 305 extending in a first direction DR1 and a second direction DR2 which crosses the first direction DR1. A magnetic field or an electric field emitted from the stylus pen may have an electromagnetic effect on the wirings 305, and accordingly, the digitizer 300 may detect a location or point of the digitizer 300 which is closest to the stylus pen. Further, the wirings 305 may generate a magnetic field or an electric field by electric current inputted to the wirings 305. The magnetic field or the electric field emitted from the wirings 305 may have an electromagnetic effect on the stylus pen, and accordingly, the digitizer 300 and the stylus pen may communicate with each other to perform various input functions of the display device 10.

In an embodiment, the wirings 305 may include a metal, an alloy, a metal nitride, a conductive metal oxide, a transparent conductive material or the like. In an embodiment, for example, the wirings 305 may include at least one of gold (Au), silver (Ag), aluminum (Al), platinum (Pt), nickel (Ni), copper (Cu), titanium (Ti), palladium (Pd), magnesium (Mg), calcium (Ca), lithium (Li), chromium (Cr), tantalum (Ta), molybdenum (Mo), scandium (Sc), neodymium (Nd), Iridium (Ir), tungsten (W), tungsten nitride ($WN_x$), titanium nitride ($TiN_x$), tantalum nitride ($TaN_x$), strontium ruthenium oxide ($SrRu_xO_y$), zinc oxide ($ZnO_x$), indium tin oxide ("ITO"), tin oxide ($SnO_x$), indium oxide ($InO_x$), gallium oxide ($GaO_x$), indium zinc oxide ("IZO") and alloy thereof.

A first opening OP1 may be defined in the digitizer 300. An inner sidewall of the digitizer 300 may define the first opening OP1. The first opening OP1 may overlap or correspond to the sensing area SA (e.g., sensor opening). Accordingly, the first opening OP1 may be disposed within the display area DA in a plan view. The wirings 305 may be disconnected at the first opening OP1.

The digitizer 300 may be referred to as a lower substrate or a lower board.

The cushion layer 400 may be disposed between the display panel 100 and the digitizer 300. The cushion layer 400 may alleviate impact applied to the display panel 100 from outside thereof. The cushion layer 400 may include a foam or a gel. In an embodiment, for example, the cushion layer 400 may include a polymer resin such as polyurethane ("PU"), polycarbonate ("PC"), polypropylene ("PP") or the like, a urethane foam, a foam sponge or the like.

A second opening OP2 may be defined in the cushion layer 400. An inner sidewall of the cushion layer 400 may define the second opening OP2. The second opening OP2 may overlap or correspond to the first opening OP1. The lower surface of the display panel 100 may be exposed to outside the digitizer 300 and the cushion layer 400 through the first opening OP1 and the second opening OP2 aligned with each other.

The sensor 500 may be disposed in the first opening OP1 and the second opening OP2. The sensor 500 may be exposed to outside the digitizer 300 and the cushion layer 400 through the first opening OP1 and the second opening OP2 which are aligned with each other. In an embodiment, the sensor 500 may be a fingerprint recognition sensor using an infrared ray, an ultrasonic wave or the like. However, embodiments are not limited thereto. In an embodiment, for example, the sensor 500 may be an iris recognition sensor, a proximity sensor or the like.

In an embodiment, the sensor 500 may be spaced apart from an inner sidewall of the digitizer 300 and/or an inner sidewall of the cushion layer 400 in a direction along the display panel 100. Thus, a size of the first opening OP1 and a size of the second opening OP2 may be greater than a size of the sensor 500. A size of the first opening OP1 and a size of the second opening OP2 may be defined along the first direction DR1 and/or the second direction DR2, or along a plane defined by the first direction DR1 and the second direction DR2 which cross each other.

The first circuit substrate 600 may be disposed under the sensor 500. The first circuit substrate 600 may contact a lower surface of the digitizer 300, and may cover the sensor 500. The first circuit substrate 600 may extend across the opening defined by the first opening OP1 together with the second opening OP2. Accordingly, along a same direction, a size of the first circuit substrate 600 may be greater than the size of the first opening OP1.

The first circuit substrate 600 may electrically connect the disconnected portions of the wirings 305 of the digitizer 300 to each other. The first circuit substrate 600 may be referred to as a connection substrate, a connection board, an upper substrate or a capacitor substrate. The first circuit substrate 600 will be described in detail below.

The driving substrate 800 may be electrically connected to the display panel 100. A driving chip for driving the display panel 100 may be mounted on the driving substrate 800. The driving chip may provide electrical signals such as a driving signal or a control signal to the display panel 100.

The second circuit substrate 700 may electrically connect the sensor 500 and the driving substrate 800 to each other. The second circuit substrate 700 may extend from a side of the sensor 500 to be connected to the driving substrate 800. The second circuit substrate 700 may transmit an electrical signal such as a sensing signal generated by the sensor 500 to the driving substrate 800.

In an embodiment, the first circuit substrate 600 and the second circuit substrate 700 may be a flexible printed circuit substrate.

The heat dissipation layer 900 may be disposed under the digitizer 300. The heat dissipation layer 900 may dissipate heat generated from the display panel 100. The heat dissipation layer 900 may include metal such as copper (Cu), aluminum (Al) or the like, graphite, carbon nanotube, heat pipe or the like.

Figure 4A:
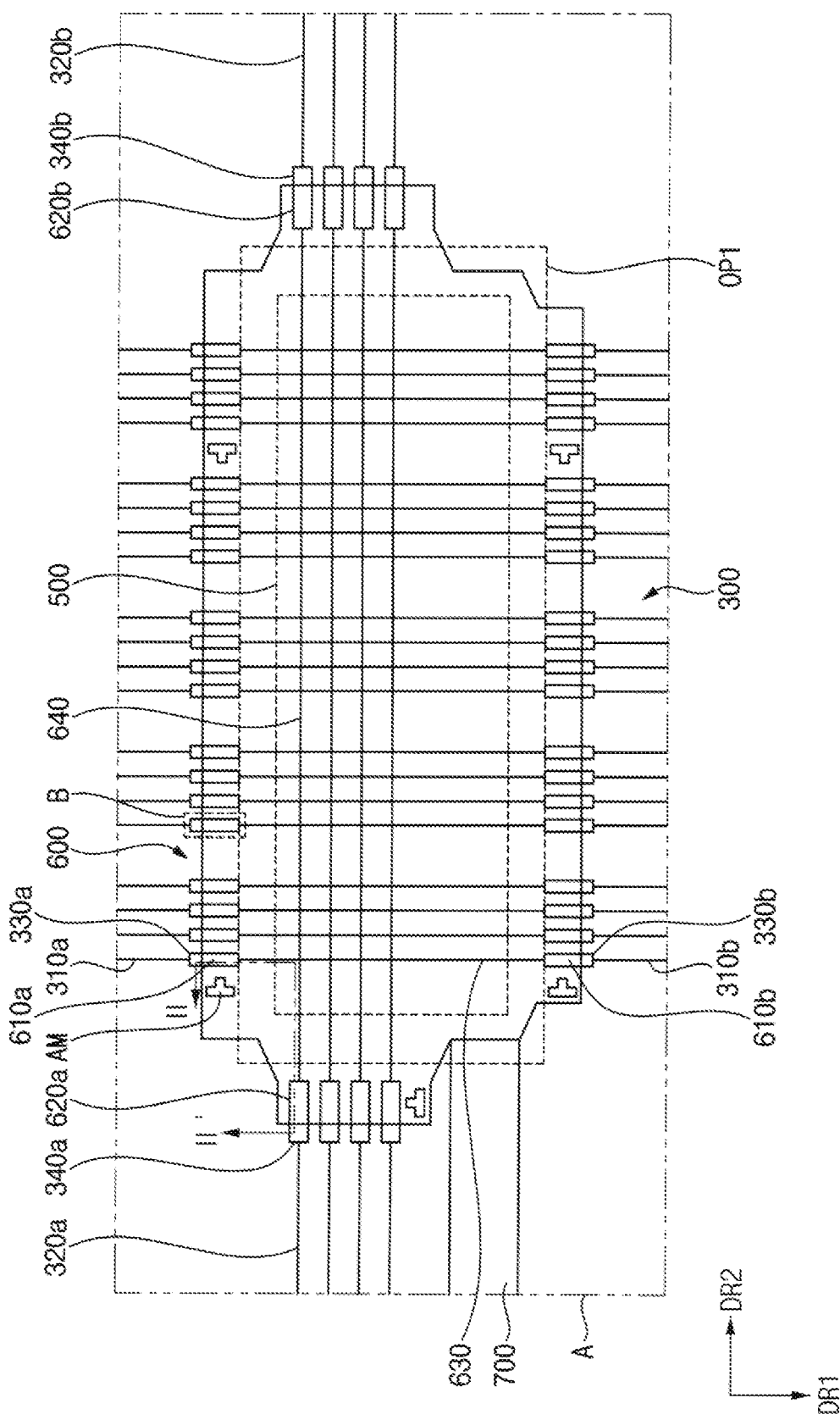
FIG. 4A is an enlarged plan view illustrating region 'A' of FIG. 2A.
Figure 4B:
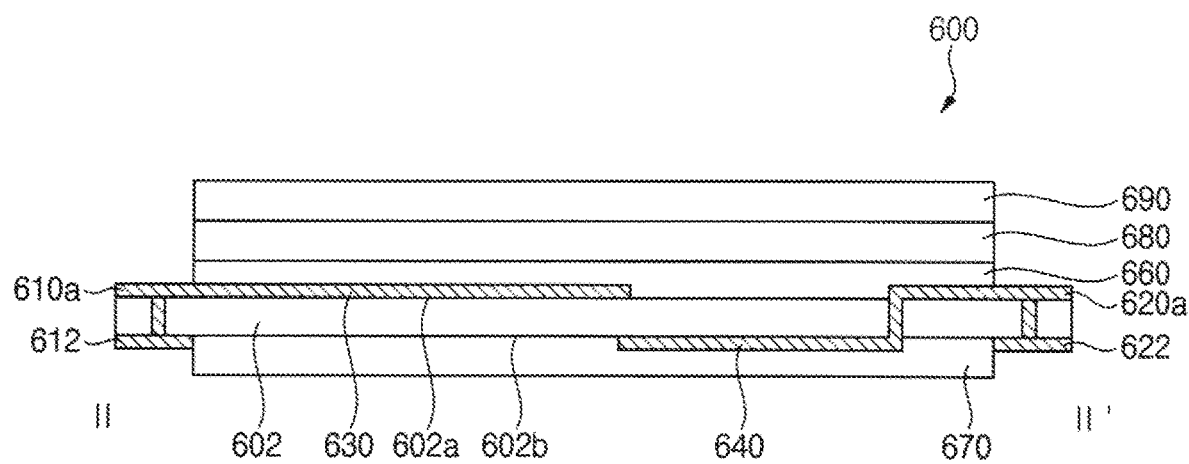
FIG. 4B is a cross-sectional view taken along line II-II' of FIG. 4A.

FIG. 4A is an enlarged plan view illustrating region 'A' of FIG. 2A. FIG. 4B is a cross-sectional view taken along line II-IF of FIG. 4A.

Referring to FIGS. 4A and 4B, among the plurality of wirings 305, the digitizer 300 may include a plurality of first wirings extending along the first direction DR1 and a plurality of second wirings extending along the second direction DR2. The first wirings may include a first portion 310a and a second portion 310b which are spaced apart from each other by the first opening OP1. The second wirings may include a first portion 320a and a second portion 320b which are spaced apart from each other by the first opening OP1.

The first circuit substrate 600 may electrically connect the first portion 310a and the second portion 310b of the first wirings to each other. Furthermore, the first circuit substrate 600 may electrically connect the first portion 320a and the second portion 320b of the first wirings to each other.

In an embodiment, the digitizer 300 may include a plurality of first connection pads 330a and 330b which are adjacent to the first opening OP1 and electrically connected to the first wirings. Furthermore, the digitizer 300 may include a plurality of second connection pads 340a and 340b which are adjacent to the first opening OP1 and electrically connected to the second wirings. The digitizer 300 includes a first inner sidewall which is provided in plural and extends along the first direction DR1 at the first opening OP1 to define a first side of the first opening OP1, and a second inner sidewall which is provided in plural and extends along the second direction DR2 at the first opening OP1 to define a second side of the first opening OP1.

In an embodiment, for example, the connection pads 330a, 330b, 340a and 340b may include a same material as the first and second wirings.

In an embodiment, the first connection pads 330a and 330b may be respectively arranged along the second direction DR2, and the second connection pads 340a and 340b may be respectively arranged along the first direction DR1. In an embodiment, for example, the first connection pads 330a and 330b may be respectively arranged spaced apart from each other along a first side of the first opening OP1, and the second connection pads 340a and 340b may be respectively arranged spaced apart from each other along a second side of the first opening OP1. In an embodiment, the second side may be perpendicular to the first side, without being limited thereto.

The first connection pads 330a and 330b and the second connection pads 340a and 340b may be referred to as first digitizer pads and second digitizer pads, respectively, or referred to as first lower connection pads and second lower connection pads, respectively.

In an embodiment, the first circuit substrate 600 may include a first connection wiring 630 and a second connection wiring 640. In an embodiment, the first connection wiring 630 may extend along the first direction DR1, and the second connection wiring 640 may extend along the second direction DR2 to cross the first connection wiring 630. The first connection wiring 630 may be electrically connected to the first wiring of the digitizer 300, and the second connection wiring 640 may be electrically connected to the second wiring of the digitizer 300.

In an embodiment, the first circuit substrate 600 may include first transfer pads 610a and 610b which are respectively to opposing ends of the first connection wiring 630, and second transfer pads 620a and 620b which are respectively connected to opposing ends of the second connection wiring 640. The first transfer pads 610a and 610b and the second transfer pads 620a and 620b may be referred to as first connection substrate pads and second connection substrate pads, respectively, or to as first upper connection pads and second upper connection pads, respectively.

The first circuit substrate 600 may further include a supporting substrate 602, a first protective layer 660, a second protective layer 670, an electromagnetic-shielding layer 680 and a third protective layer 690. The first connection wiring 630 may be exposed outside the first circuit substrate 600 to define the first transfer pads 610a and 610b. The second connection wiring 640 may be exposed outside the first circuit substrate 600 to define the second transfer pads 620a and 620b.

In an embodiment, the first transfer pads 610a and 610b, the second transfer pads 620a and 620b and the first connection wiring 630 may be disposed on a supporting substrate upper surface 602a of the supporting substrate 602. The second connection wiring 640 may be disposed on a supporting substrate lower surface 602b of the supporting substrate 602 and may be electrically connected to the second transfer pads 620a and 620b through a conductive connection via passing through a thickness of the supporting substrate 602. The supporting substrate lower surface 602b may be opposite to the supporting substrate upper surface 602a.

In an embodiment, the first circuit substrate 600 may further include lower contact pads 612 and 622 disposed on the supporting substrate lower surface 602b of the supporting substrate 602. The lower contact pads 612 and 622 may be electrically connected to the transfer pads 610a, 610b, 620a and 620b or the connection wiring through a conductive connection via passing through the thickness of the supporting substrate 602. That is, the transfer pads 610a, 610b, 620a and 620b or the connection wiring may be exposed outside the first circuit substrate 600 to define the lower contact pads 612 and 622. The lower contact pads 612 and 622 may electrically contact the connection pads 330a, 330b, 340a and 340b of the digitizer 300 or a conductive solder which bonds the first circuit substrate 600 to the digitizer 300, to increase an electric path thereby improving reliability of electrical connection between the first circuit substrate 600 and the digitizer 300.

The transfer pads 610a, 610b, 620a and 620b and the lower contact pads 612 and 622 may be exposed outside the first circuit substrate 600 at opposing sides of the first circuit substrate 600. In FIG. 4B, for example, an upper surface and an outer sidewall of each of the transfer pads 610a, 610b, 620a and 620b are exposed to outside the first circuit substrate 600. Additionally, a lower surface and an outer sidewall of each of the lower contact pads 612 and 622 are exposed to outside the first circuit substrate 600. The first connection wiring 630, the second connection wiring 640, the transfer pads 610a, 610b, 620a and 620b and the lower contact pads 612 and 622 may include a conductive material.

The first protective layer 660 may cover the supporting substrate upper surface 602a of the supporting substrate 602 and the first connection wiring 630. The second protective layer 670 may cover the supporting substrate lower surface 602b of the supporting substrate 602 and the second connection wiring 640.

The electromagnetic-shielding layer 680 may be disposed on the first protective layer 660. The electromagnetic-shielding layer 680 may block electrical or magnetic interference to the sensor 500 or the first circuit substrate 600. The third protective layer 690 may cover the electromagnetic-shielding layer 680. Along a third direction crossing each of the first direction DR1 and the second direction DR2 (e.g., vertical in FIG. 4B), the third protective layer 690, the electromagnetic-shielding layer 680, the first protective layer 660, the supporting substrate 602 and the second protective layer 670 may be in order in a direction toward the digitizer 300 and/or the sensor 500, without being limited thereto.

Embodiments are not limited to the above-illustrated configuration. In an embodiment, for example, the electromagnetic-shielding layer 680 may be disposed on the second protective layer 670 depending on a position of the sensor 500, and the third protective layer 690 may be disposed under the electromagnetic-shielding layer 680.

The supporting substrate 602 and the first to third protective layers 660, 670 and 690 may each include a polymeric material. In an embodiment, for example, the supporting substrate 602 and the first to third protective layers 660, 670 and 690 may each include polyimide, polyamide, polyolefin, polycarbonate, polyethylene terephthalate or a combination thereof.

The first transfer pads 610a and 610b of the first circuit substrate 600 may be electrically connected to the first connection pads 330a and 330b of the digitizer 300, respectively. The second transfer pads 620a and 620b of the first circuit substrate 600 may be electrically connected to the second connection pads 340a and 340b of the digitizer 300, respectively.

Referring to FIG. 4A, for example, the first transfer pads 610a and 610b may be respectively arranged along the second direction DR2 along the first side of the first opening OP1 to overlap or face the first connection pads 330a and 330b respectively corresponding to the transfer pads 610a, 610b, 620a and 620b. The second transfer pads 620a and 620b may be respectively arranged along the first direction DR1 along the second side of the first opening OP1 to overlap or the second connection pads 340a and 340b respectively corresponding to the transfer pads 610a, 610b, 620a and 620b. The first transfer pads 610a and 610b and the second transfer pads 620a and 620b may be electrically connected to the first connection pads 330a and 330b and the second connection pads 340a and 340b through a solder SL (e.g., solder pattern).

The solder SL may electrically connect and bond the transfer pads 610a, 610b, 620a and 620b to the connection pads 330a, 330b, 340a and 340b, respectively to each other. A substrate conductive bonding structure may include a transfer pad of an upper substrate which overlaps the connection pad of a lower substrate, is exposed to outside the upper substrate at the end of the upper substrate and includes an upper surface which is furthest from the lower substrate, and the solder SL contacting the upper surface of the connection pad, extending to the upper surface of the transfer pad and into the slit 616 which is defined in the transfer pad. In an embodiment, the substrate conductive bonding structure may include a first solder contacting the first connection pad 330a of the digitizer 300, extending to the first transfer pad 610a of the connection substrate and into the slit 616 which is defined in the first transfer pad 610a to bond the digitizer 300 to the connection substrate, and a second solder contacting the second connection pad 340a of the digitizer 300 and extending to the second transfer pad 620a of the connection substrate to bond the digitizer 300 to the connection substrate.

Even though FIG. 4A illustrates that the first transfer pads 610a and 610b and the second transfer pads 620a and 620b are arranged along different sides of the first opening OP1, embodiments are not limited thereto. In an embodiment, for example, the first transfer pads 610a and 610b and the second transfer pads 620a and 620b of the first circuit substrate 600 may be arranged at a same side of the first circuit substrate 600. In this case, the first connection pads 330a and 330b and the second connection pads 340a and 340b of the digitizer 300 may be arranged at a same side of the digitizer 300 along which the first transfer pads 610a and 610b and the second transfer pads 620a and 620b are arranged. Thus, the first portion 320a and the second portion 320b of the second wirings of the digitizer 300 and the second connection wiring 640 of the first circuit substrate 600 may be curved or bent to be connected to the transfer pads 610a, 610b, 620a and 620b and the connection pads 330a, 330b, 340a and 340b which are all at a same side as each other.

The first circuit substrate 600 may further include an alignment mark AM adjacent to the transfer pads 610a, 610b, 620a and 620b. The alignment mark AM may be used for identifying and adjusting a position of the digitizer 300 or position of the first circuit substrate 600 relative to each other during combining of the first circuit substrate 600 with the digitizer 300.

Hereinafter, a substrate conductive bonding structure capable of improving bonding reliability and alignment reliability with a solder SL bonding a connection pad and a transfer pad will be explained in detail.

Figure 6:
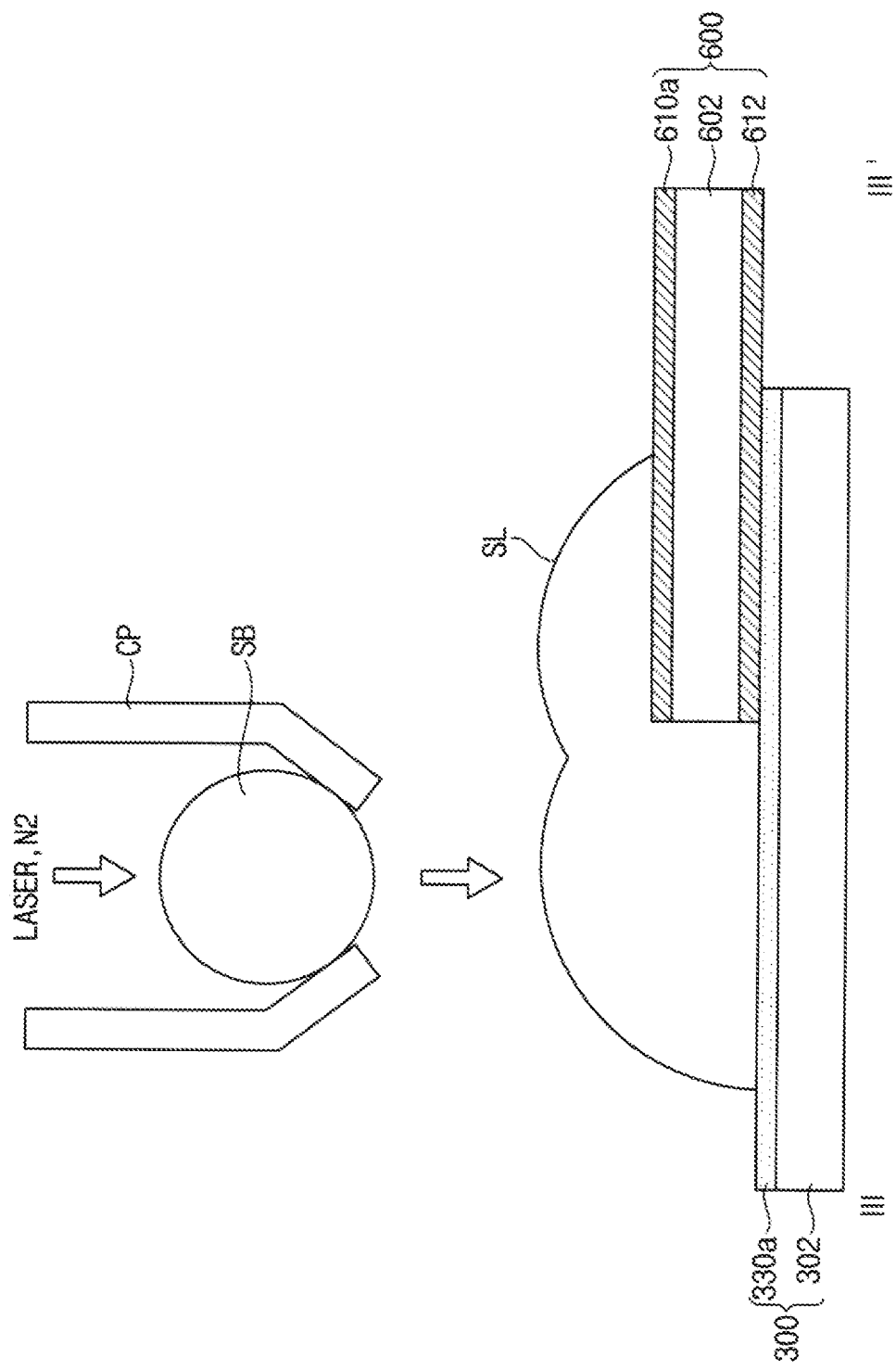
FIG. 6 is a cross-sectional view taken along line of FIG. 5.
Figure 7:
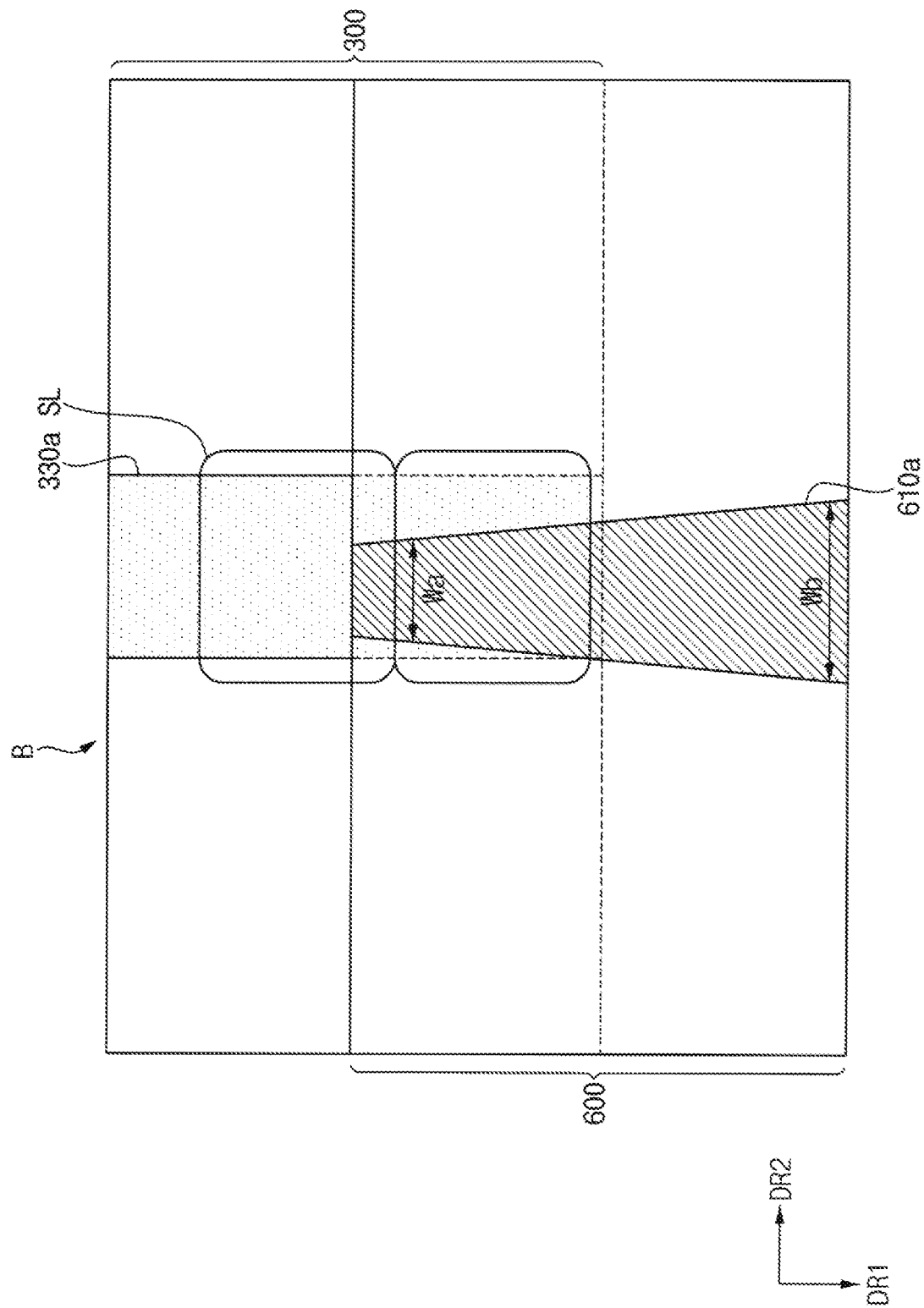
FIGS. 7 and 8 are plan views illustrating embodiments of misaligning in a bonding structure of a display device.
Figure 8:
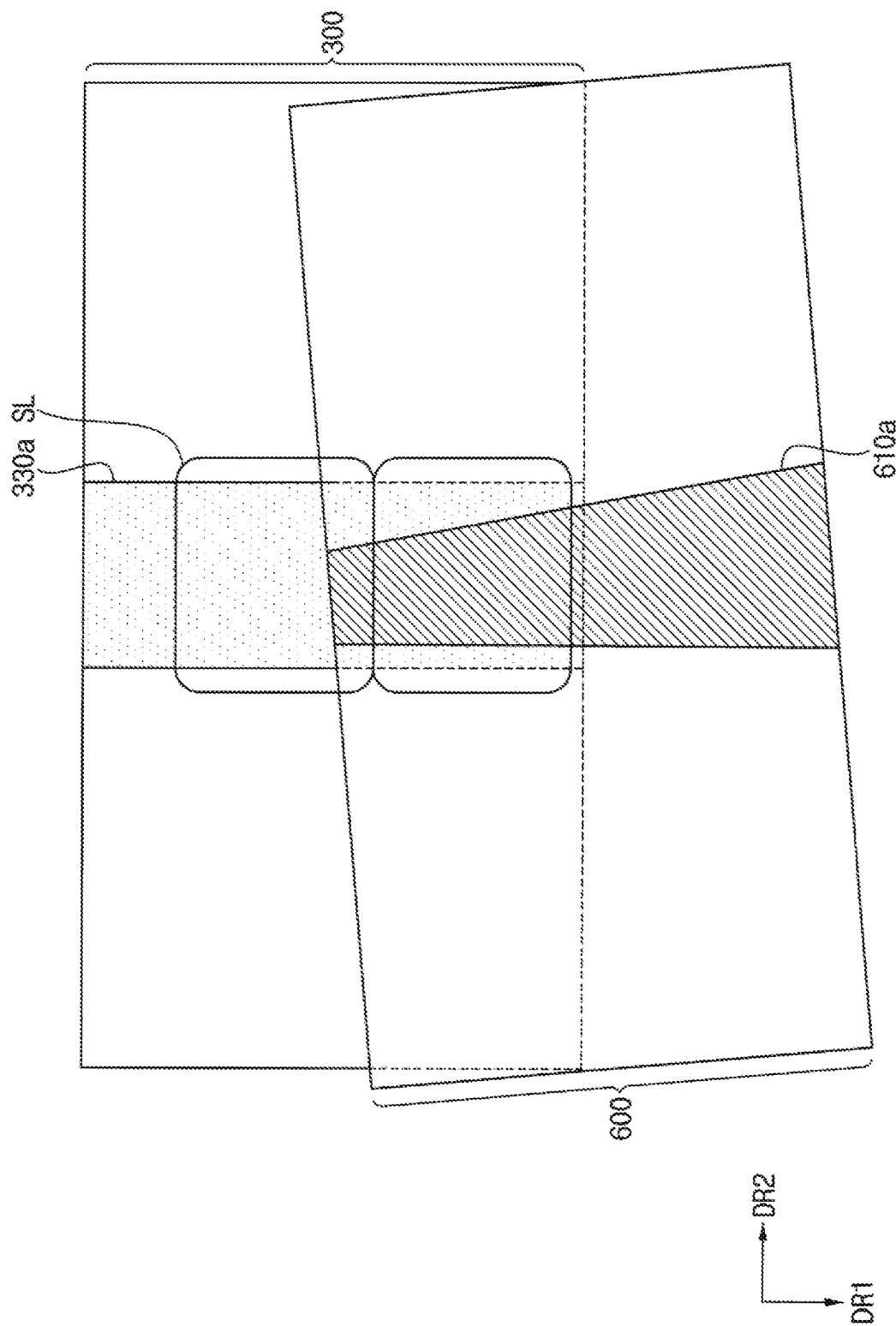

FIG. 5 is an enlarged plan view illustrating an embodiment of region 'B' of FIG. 4A. FIG. 6 is a cross-sectional view taken along line of FIG. 5. FIGS. 7 and 8 are plan views illustrating embodiments of a misaligned bonding structure of a display device 10.

Referring to FIGS. 5 and 6, a first transfer pad 610a of a first circuit substrate 600 is disposed on a first connection pad 330a of a digitizer 300. The first transfer pad 610a may partially overlap the first connection pad 330a. As overlapping, the first transfer pad 610a may face the first connection pad 330a along a thickness direction (e.g., third direction). A similar configuration may be understood where a first transfer pad 610b, a second transfer pad 620a and a second transfer pad 620b of a first circuit substrate 600 is disposed on (or facing) a first connection pad 330b, a second connection pad 340a and a second connection pad 340b of a digitizer 300, respectively.

A solder SL is disposed on an upper surface of the first transfer pad 610a and an upper surface of the first connection pad 330a. The solder SL may extend along an outer sidewall of the first circuit substrate 600 from the upper surface of the first transfer pad 610a to the upper surface of the first connection pad 330a. The solder SL may contact each of an outer sidewall of the first transfer pad 610a and an outer sidewall of the first transfer pad 610a which are exposed to outside the first circuit substrate 600. Thus, the first transfer pad 610a may be electrically connected to the first connection pad 330a by contact therebetween and further by the solder SL in contact therewith. As being in contact, elements may form an interface therebetween.

In an embodiment, the solder SL may be provided or formed by a jet-soldering method. In an embodiment of a method of providing a display device 10 the digitizer 300 and the first circuit substrate 600 are disposed to face each other and partially overlap each other. A melted solder is provided on exposed upper surfaces of the first transfer pad 610a and the first connection pad 330a. The solder SL may include a metal having a relatively low melting point. In an embodiment, for example, the solder SL may include copper, tin, gold, silver, lead, nickel or a combination thereof. However, embodiments are not limited thereto, and the solder SL may include various solder materials that are known in the art.

As illustrated in FIG. 6, for example, after a solder ball SB (e.g., preliminary solder) is disposed at an outlet of a capillary CP, laser (LASER in FIG. 6) may be irradiated to the solder ball SB to melt the solder ball SB. Thereafter, pressing gas such as nitrogen gas (N2 in in FIG. 6) may be applied to the melted solder ball SB thereby applying a force to move the melted solder ball SB from the capillary CP to the first transfer pad 610a and the first connection pad 330a. The solder ball SB may be repeatedly provided as desired.

The first connection pad 330a may be disposed on a supporting structure 302 and exposed to outside the digitizer 300. The supporting structure 302 may have a multi-layered structure including an insulation layer for insulating electrodes of the digitizer 300, a protective layer for protecting the electrodes, an adhesive layer and the like.

A lower contact pad 612 may be disposed under the supporting substrate 602. The lower contact pad 612 may overlap the first transfer pad 610a in a plan view. The lower contact pad 612 may a planar shape substantially same as or different from the first transfer pad 610a. Similar structure may apply to lower contact pad 622.

The lower contact pad 612 of the first circuit substrate 600 may contact the first connection pad 330a of the digitizer 300. The lower contact pad 612 may be electrically connected to the first transfer pad 610a through a conductive via provided or formed through the supporting substrate 602. Thus, an electric resistance of the bonding structure may be reduced, and a contact area of the bonding structure may be increased. Thus, connection reliability of the bonding structure may be improved.

Referring to FIG. 5, the first transfer pad 610a of the first circuit substrate 600 and the first connection pad 330a of the digitizer 300 may have a major dimension (e.g., length) along a first direction and a minor dimension (e.g., a width) along the second direction DR2. In an embodiment, the first transfer pad 610a may have a planar shape which has a tapered width along a first direction DR1. In an embodiment, for example, a first width Wa of a first end of the first transfer pad 610a which is closest to the first connection pad 330a may be smaller than a second width Wb of a second end opposite to the first end and furthest from the first connection pad 330a. In an embodiment, the first width Wa of the first end of the first transfer pad 610a may be smaller than a third width Wp of the first connection pad 330a.

The first circuit substrate 600 combined with the digitizer 300 may define a misalignment therebetween. In an embodiment, for example, the first circuit substrate 600 and/or the digitizer 300 may be shifted along the first direction DR1 or along the second direction DR2 from an alignment position. Furthermore, a side of the first circuit substrate 600 which is not parallel to a side of the digitizer 300 may define a misalignment due to tilting.

According to an embodiment, the first transfer pad 610a has a tapered planar shape. Thus, even when the first circuit substrate 600 or the digitizer 300 is shifted in a horizontal direction (e.g., along the second direction DR2) or tilted as illustrated in FIGS. 7 and 8, respectively, the first transfer pad 610a and the first connection pad 330a may be overlapped in a range. That is, an overlapping planar area of the first transfer pad 610a and the first connection pad 330a may be in a range to provide reliable electrical connection therebetween.

Within the first circuit substrate 600, the lower contact pad 612 may have a rectangular planar shape, or may have a tapered planar shape similar to the first transfer pad 610a.

Figure 9:
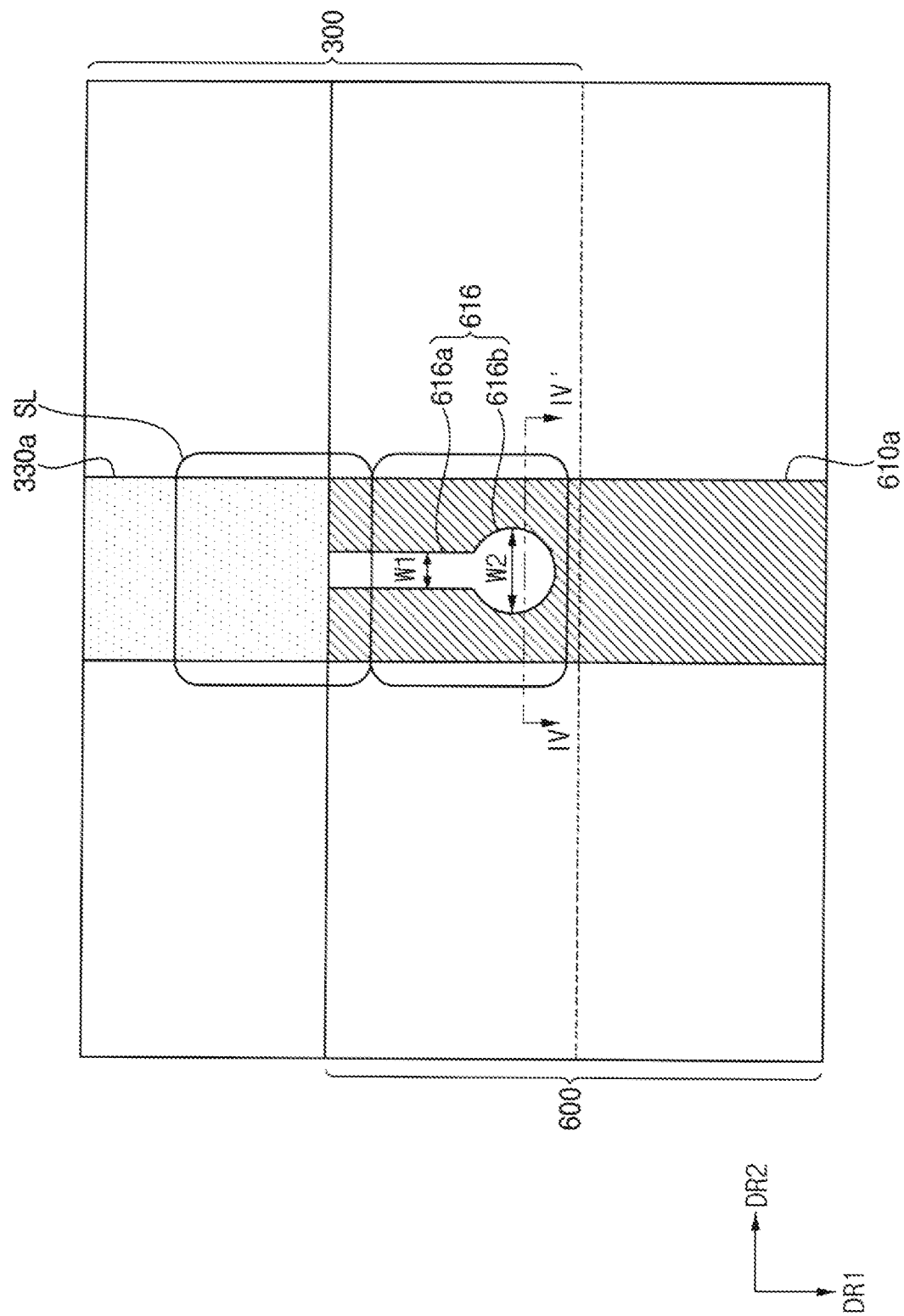
FIG. 9 is a plan view illustrating an embodiment of a bonding structure of a display device.
Figure 10:
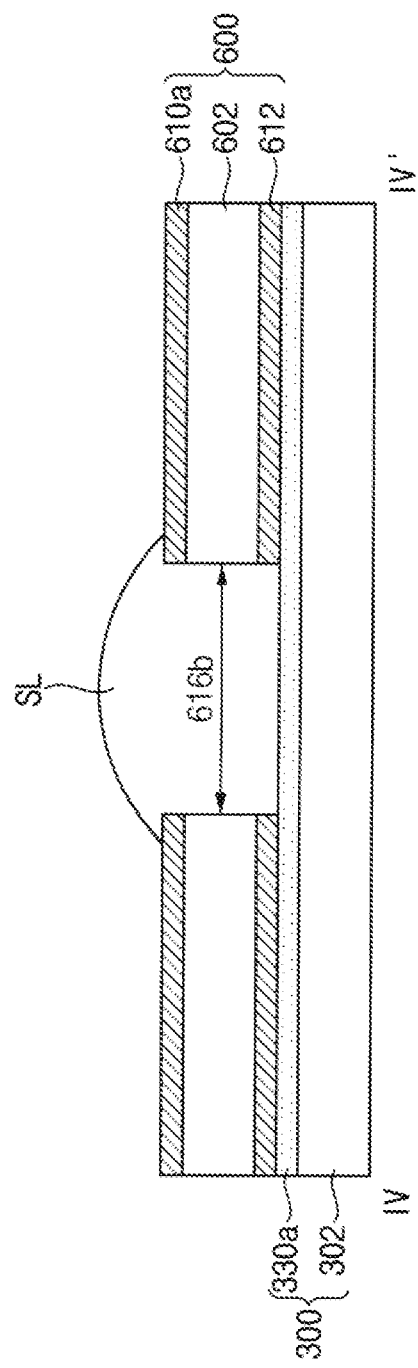
FIG. 10 is a cross-sectional view taken along line IV-IV' of FIG. 9.

FIG. 9 is a plan view illustrating an embodiment of a bonding structure of a display device 10. FIG. 10 is a cross-sectional view taken along line IV-IV' of FIG. 9.

Referring to FIGS. 9 and 10, a first transfer pad 610a of a first circuit substrate 600 is disposed facing a first connection pad 330a of a digitizer 300. The first transfer pad 610a may partially overlap the first connection pad 330a. A solder SL is disposed on an upper surface of the first transfer pad 610a and an upper surface of the first connection pad 330a. Thus, the first transfer pad 610a may be electrically connected to the first connection pad 330a.

In an embodiment, the first transfer pad 610a may include a slit 616 extended through layers of the first circuit substrate 600 which provides or defines an opening in the first circuit substrate 600. The slit 616 may be open to outside the first circuit substrate 600 at an outer sidewall thereof. The slit 616 may be open at the upper surface of a respective transfer pad. In an embodiment, the slit 616 which is open at the upper surface of the transfer pad (e.g., first transfer pad 610a) passes through the transfer pad and the supporting substrate 602 and exposes the lower contact pad 612 to outside the upper substrate (e.g., the first circuit substrate 600).

In an embodiment, for example, the slit 616 may include in order from the end of first circuit substrate 600 an extending portion 616a which extends along a first direction DR1 (e.g., along a length of the first transfer pad 610a) from the outer sidewall, and an expansion portion 616b which is connected to the extending portion 616a. Each of the extending portion 616a and the expansion portion 616b has a length along the first direction DR1 and a width along the second direction DR2. The slit 616 may have a second slit width W2 at the expansion portion 616b which is larger than a first slit width W1 at the extending portion 616a.

In an embodiment, for example, the extending portion 616a may extend from a distal end of the first transfer pad 610a and may be open at the distal end. An inner end of the extending portion 616a which is opposite to an outer end at the distal end of the first transfer pad 610a may be connected to the expansion portion 616b to provide the slit 616 as a single opening in layers of the of the first circuit substrate 600.

In an embodiment, the slit 616 may pass through an entirety of a thickness of the first circuit substrate 600 along a thickness direction. Furthermore, the solder SL may extend into the slit 616 from an upper surface of the first circuit substrate 600. An upper surface of the first connection pad 330a may be exposed to outside the first circuit substrate 600 at the slit 616. Thus, the solder SL may contact an upper surface of the first connection pad 330a through the slit 616.

In an embodiment, for example, the expansion portion 616b may have a circular shape in a plan view. However, embodiments are not limited thereto. In an embodiment, for example, the expansion portion 616b may have various planar shapes including an oval shape, a polygonal shape including a triangular shape, a rectangular shape, a rhombus shape or the like.

In an embodiment, since the upper surface of the first connection pad 330a is further exposed to outside the first circuit substrate 600 at the slit 616, a contact area between the solder SL and the first connection pad 330a may be increased. Furthermore, since the slit 616 includes the expansion portion 616b having a width larger than a width of the extending portion 616a, the contact area between the solder SL and the first connection pad 330a may be further increased. Thus, bonding reliability of the first connection pad 330a and the first transfer pad 610a to each other may be increased, and an electric resistance may be reduced. Furthermore, since a volume or space in which the solder SL is received is increased by the slit 616, a maximum height of the solder SL may be reduced. Thus, an entire thickness of a display device 10 including the bonding structure may be reduced, and an electrical short between the solder SL and another conductive component may be prevented or reduced.

Figure 11:
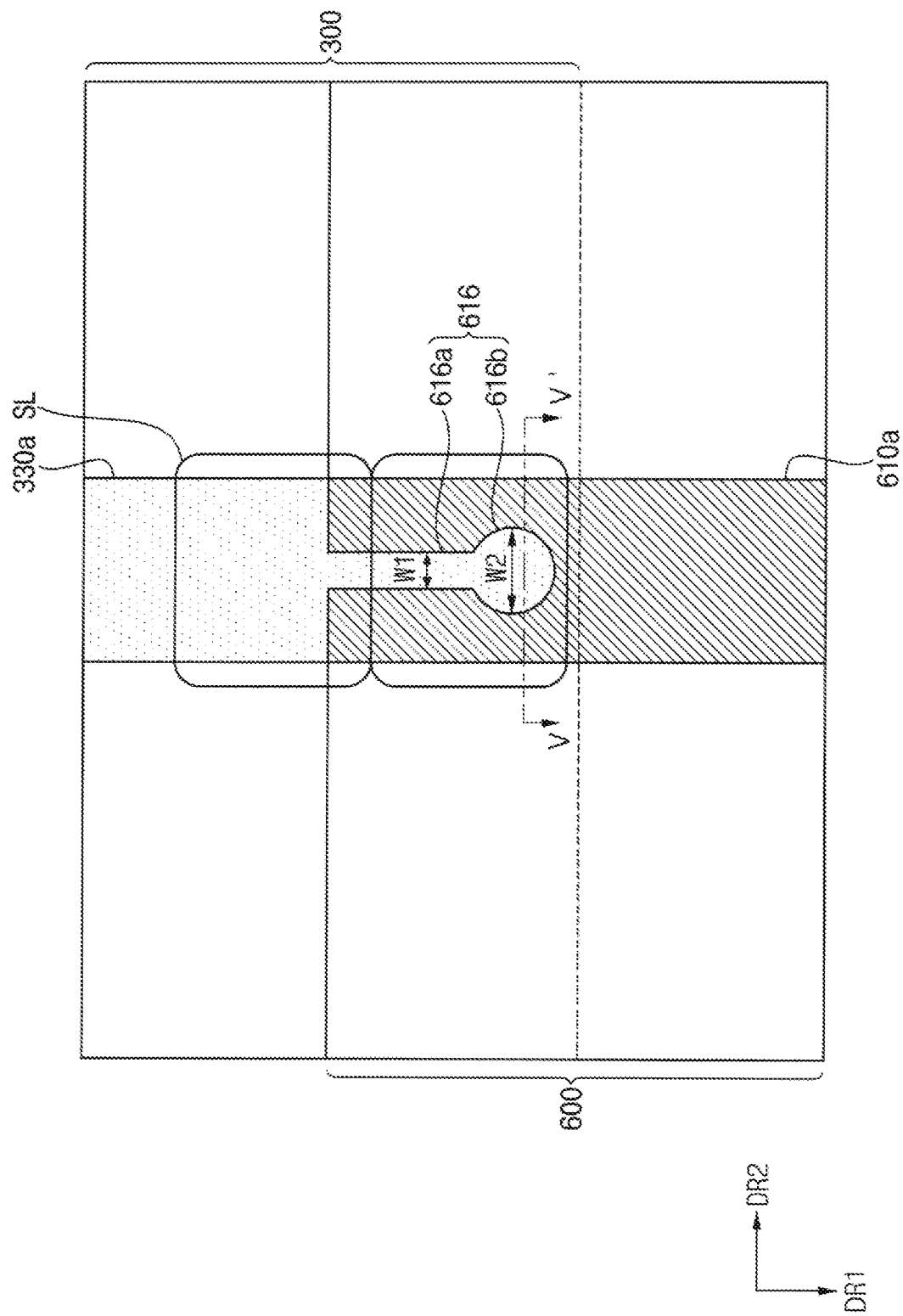
FIG. 11 is a plan view illustrating an embodiment of a bonding structure of a display device.
Figure 12:
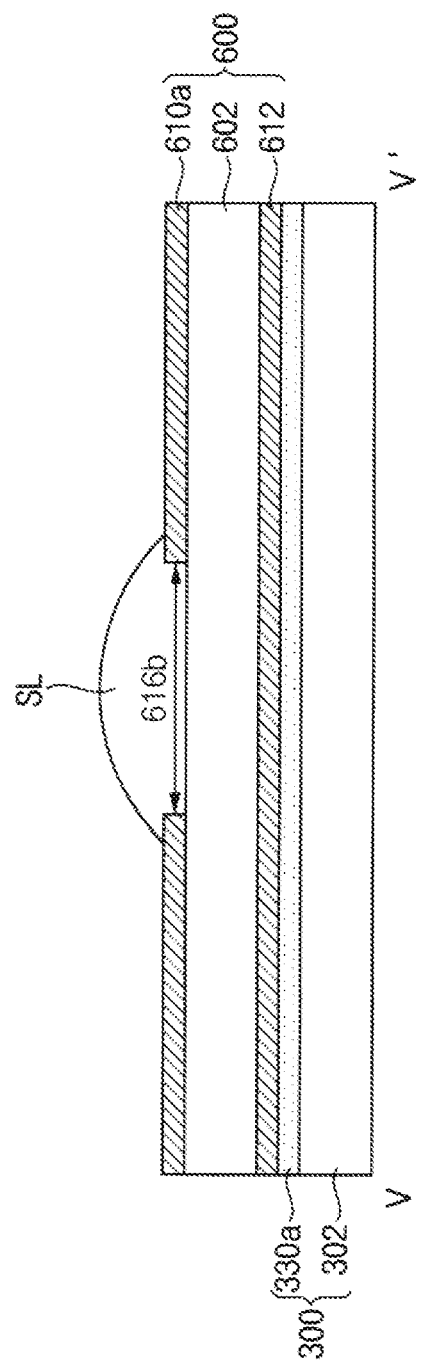
FIG. 12 is a cross-sectional view taken along line V-V' of FIG. 11.
Figure 13:
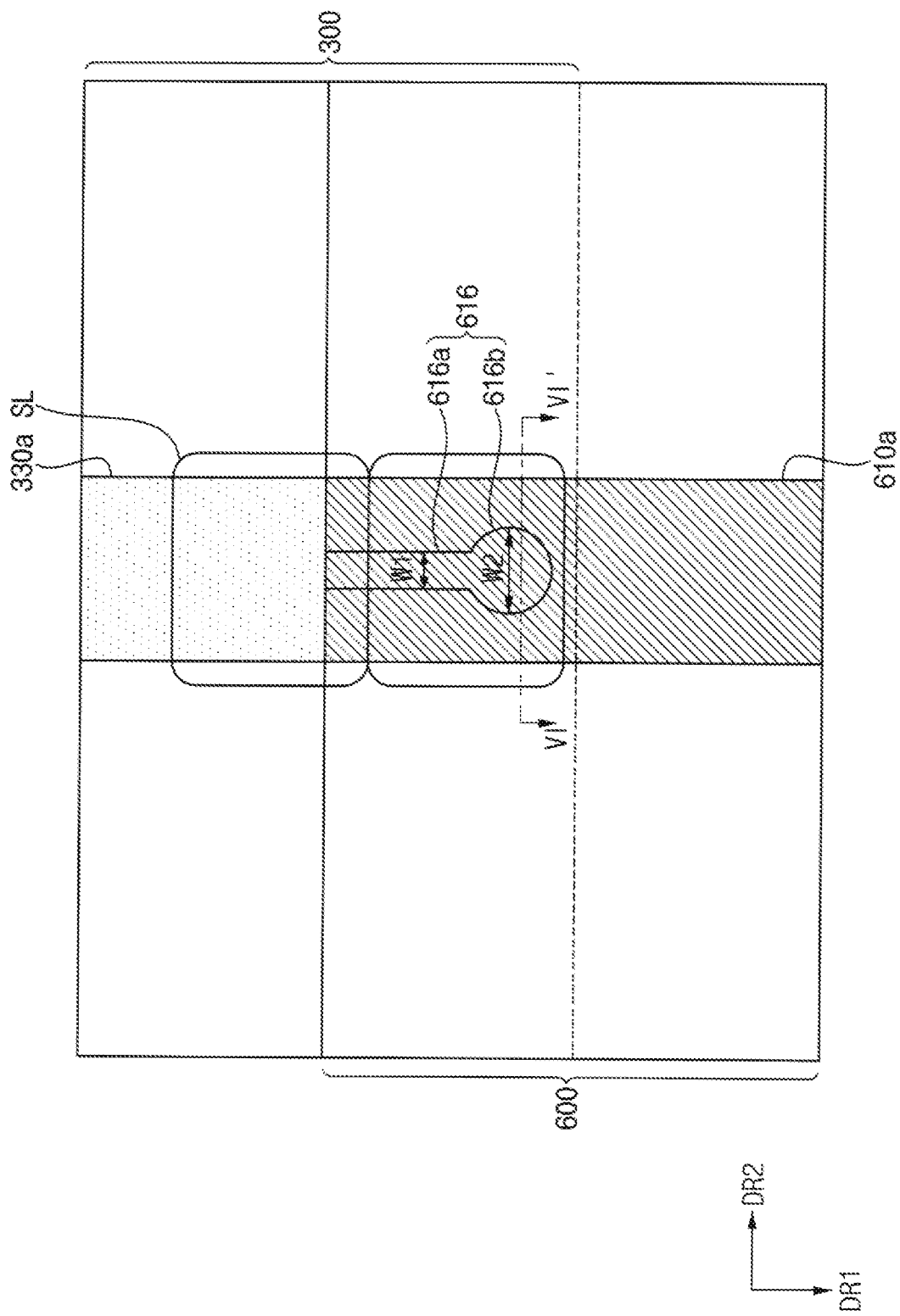
FIG. 13 is a plan view illustrating an embodiment of a bonding structure of a display device.
Figure 14:
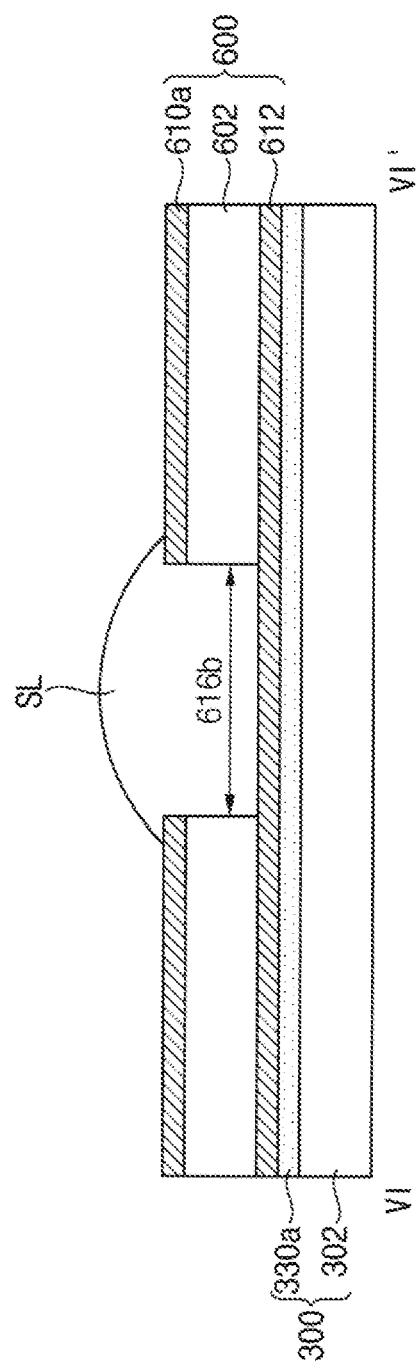
FIG. 14 is a cross-sectional view taken along line VI-VI' of FIG. 13.

FIG. 11 is a plan view illustrating an embodiment of a bonding structure of a display device 10. FIG. 12 is a cross-sectional view taken along line V-V' of FIG. 11. FIG. 13 is a plan view illustrating an embodiment of a bonding structure of a display device 10. FIG. 14 is a cross-sectional view taken along line VI-VI' of FIG. 13.

Referring to FIGS. 11 and 12, a first transfer pad 610a of a first circuit substrate 600 is disposed facing a first connection pad 330a of a digitizer 300. The first transfer pad 610a may partially overlap the first connection pad 330a. A solder SL is disposed on an upper surface of the first transfer pad 610a and extends to an upper surface of the first connection pad 330a at an outer sidewall of the first circuit substrate 600. Thus, the first transfer pad 610a may be electrically connected to the first connection pad 330a.

In an embodiment, the first transfer pad 610a may include a slit 616 providing or defining an opening in the first circuit substrate 600. In an embodiment, for example, the slit 616 may include an extending portion 616a which extends along a first direction DR1, and an expansion portion 616b which is connected to the extending portion 616a and has a second slit width W2 larger than a first slit width W1 of the extending portion 616a.

In an embodiment, the slit 616 may pass through only the first transfer pad 610a to expose an upper surface of a supporting substrate 602 disposed under the first transfer pad 610a. Thus, the solder SL may extend into the slit 616 and contact an upper surface of the supporting substrate 602 which is exposed to outside the first circuit substrate 600 through the slit 616. At the slit 616, the solder SL may contact inner sidewalls of the first transfer pad 610a which define the opening to provide increased electrical contact with the first circuit substrate 600.

Referring to FIGS. 13 and 14, a first circuit substrate 600 includes a slit 616 passing through at least a first transfer pad 610a and receiving at least a portion of a solder SL. In an embodiment, the silt 616 may pass through thicknesses of both the first transfer pad 610a and a supporting substrate 602 which is disposed under the first transfer pad 610a to expose an upper surface of a lower contact pad 612 disposed under the supporting substrate 602 to outside the first circuit substrate 600. The solder SL which extends into the slit 616 contacts the lower contact pad 612 which is exposed to outside the upper substrate (e.g., the first circuit substrate 600) by the slit 616. Thus, the solder SL may contact an upper surface of the lower contact pad 612 which is exposed to outside the first circuit substrate 600 at the slit 616. At the slit 616, the solder SL may contact inner sidewalls of both the first transfer pad 610a and the supporting substrate 602 which define the opening to provide increased electrical contact with the first circuit substrate 600.

Figure 15:
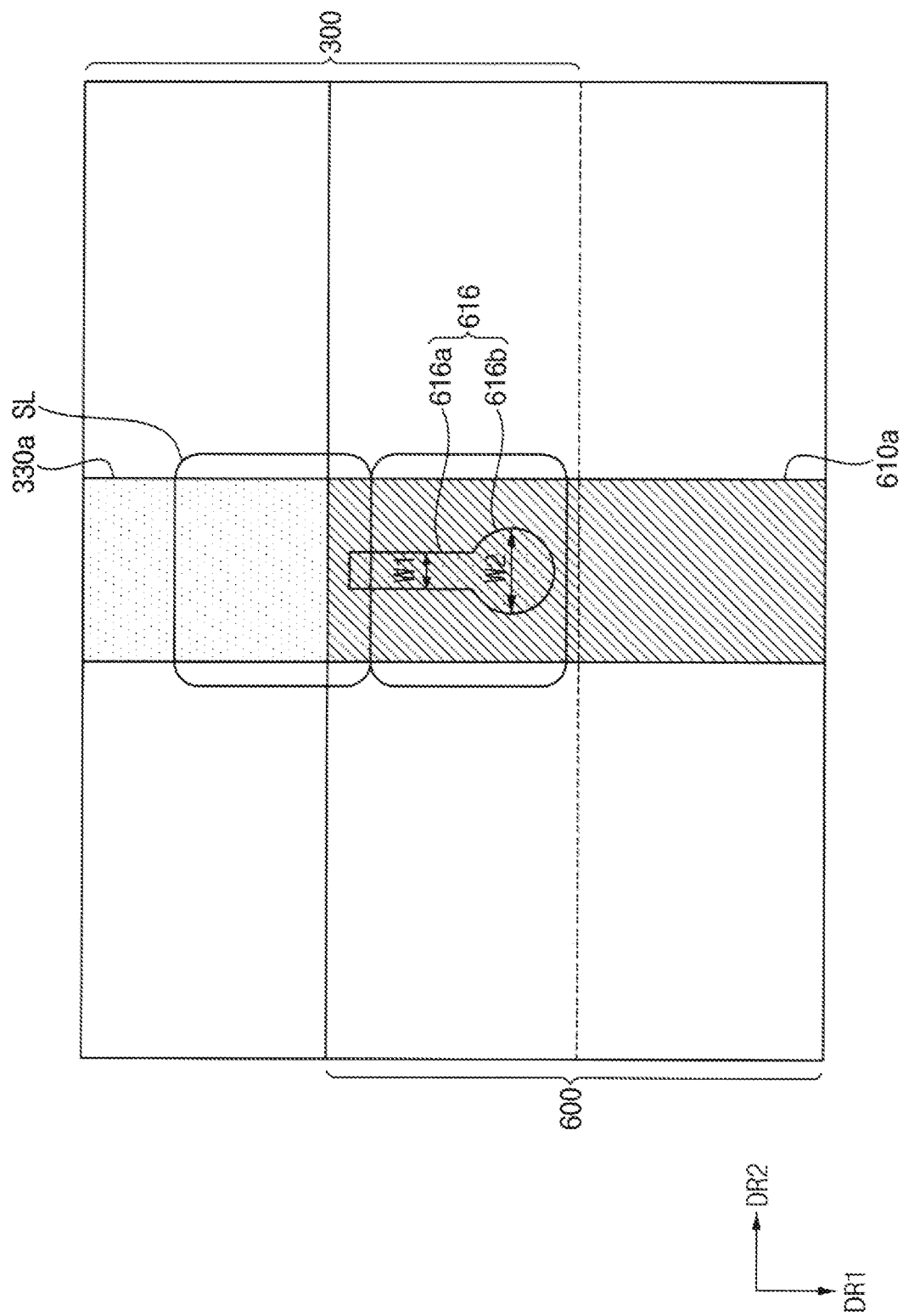
FIGS. 15, 16, 17, 18 and 19 are plan views illustrating embodiments of a bonding structure of a display device.

Referring to FIG. 15, a first circuit substrate 600 (e.g., upper substrate) includes a slit 616 passing through at least a first transfer pad 610a and receiving at least a portion of a solder SL. The slit 616 may include an extending portion 616a which extends along a first direction DR1, and an expansion portion 616b which is connected to the extending portion 616a and has a second slit width W2 larger than a first slit width W1 of the extending portion 616a. In an embodiment, the extending portion 616a may be spaced apart from an outer end of the first transfer pad 610a. The slit 616 may be closed at the distal end of the first transfer pad 610a. In an embodiment, the transfer pad includes a distal end which is closest to the end of the upper substrate, and the extending portion 616a is spaced apart from the distal end of the transfer pad.

Figure 16:
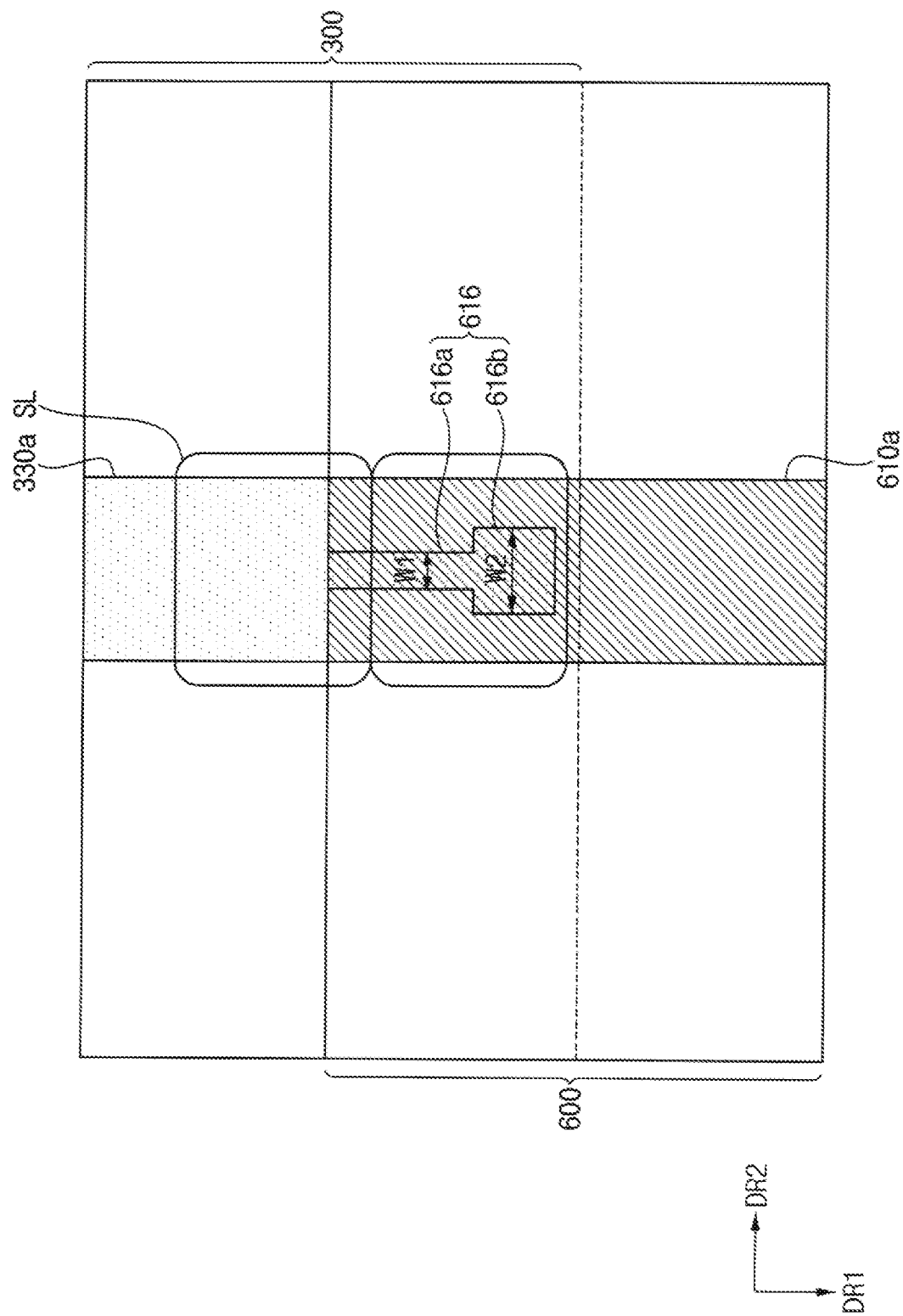

Referring to FIG. 16, a first circuit substrate 600 includes a slit 616 passing through at least a first transfer pad 610a and receiving at least a portion of a solder SL. The slit 616 may include an extending portion 616a which extends along a first direction DR1, and an expansion portion 616b which is connected to the extending portion 616a and has a second slit width W2 larger than a first slit width W1 of the extending portion 616a. In an embodiment, the expansion portion 616b may have a rectangular planar shape.

Figure 17:
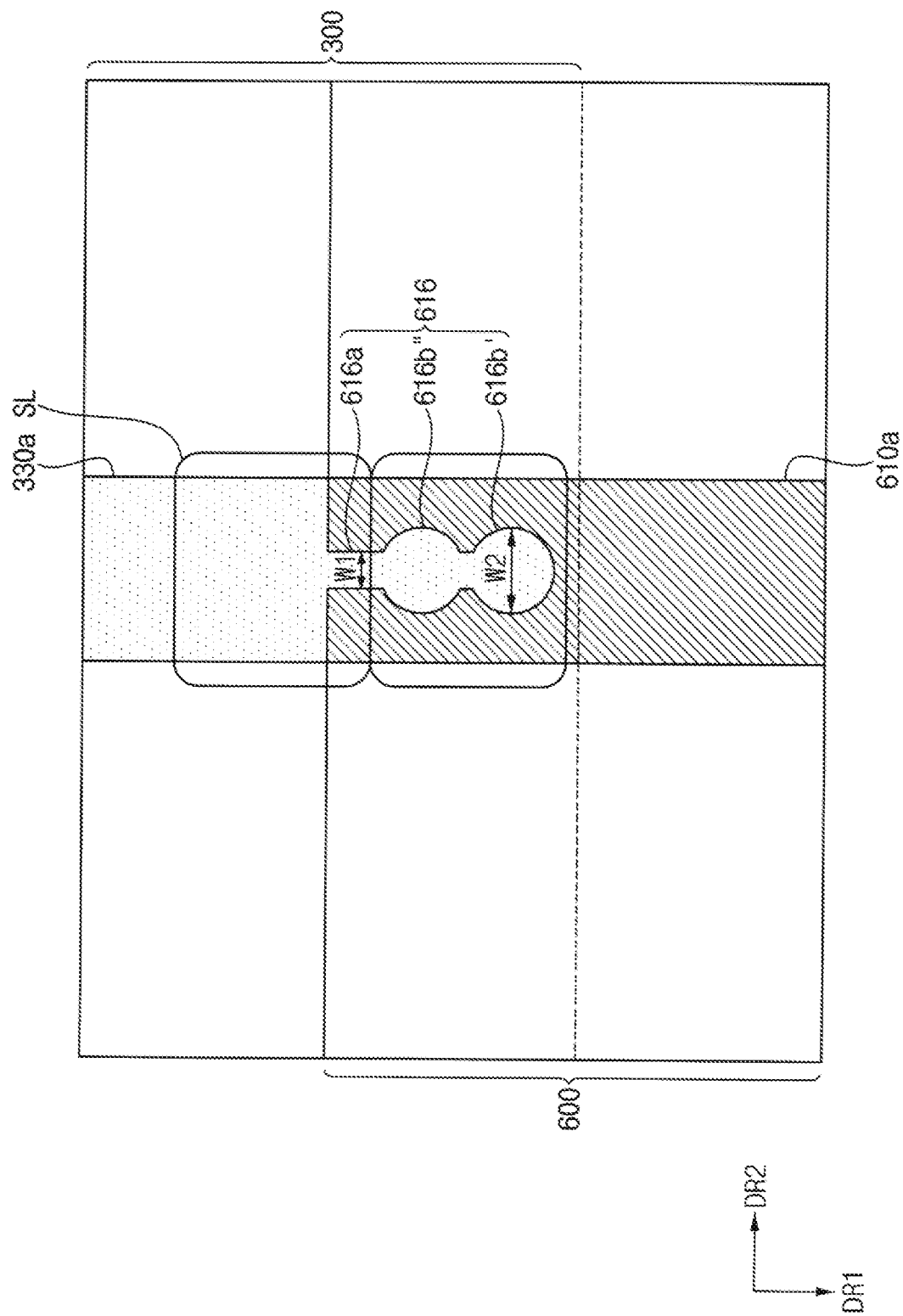

Referring to FIG. 17, a first circuit substrate 600 includes a slit 616 passing through at least a first transfer pad 610a and receiving at least a portion of a solder SL. The slit 616 may include an extending portion 616a which extends along a first direction DR1, and a plurality of expansion portions 616b' and 616b" which are each connected to the extending portion 616a and have a second slit width W2 larger than a first slit width W1 of the extending portion 616a. The plurality of expansion portions 616b' and 616b" each having the second slit width W2 may be arranged along a length of the slit 616, that is, along the first direction DR1. That is, the slit 616 includes the expansion portion provided in plural including a plurality of expansion portions 616b' and 616b" arranged along the first direction DR1.

Figure 18:
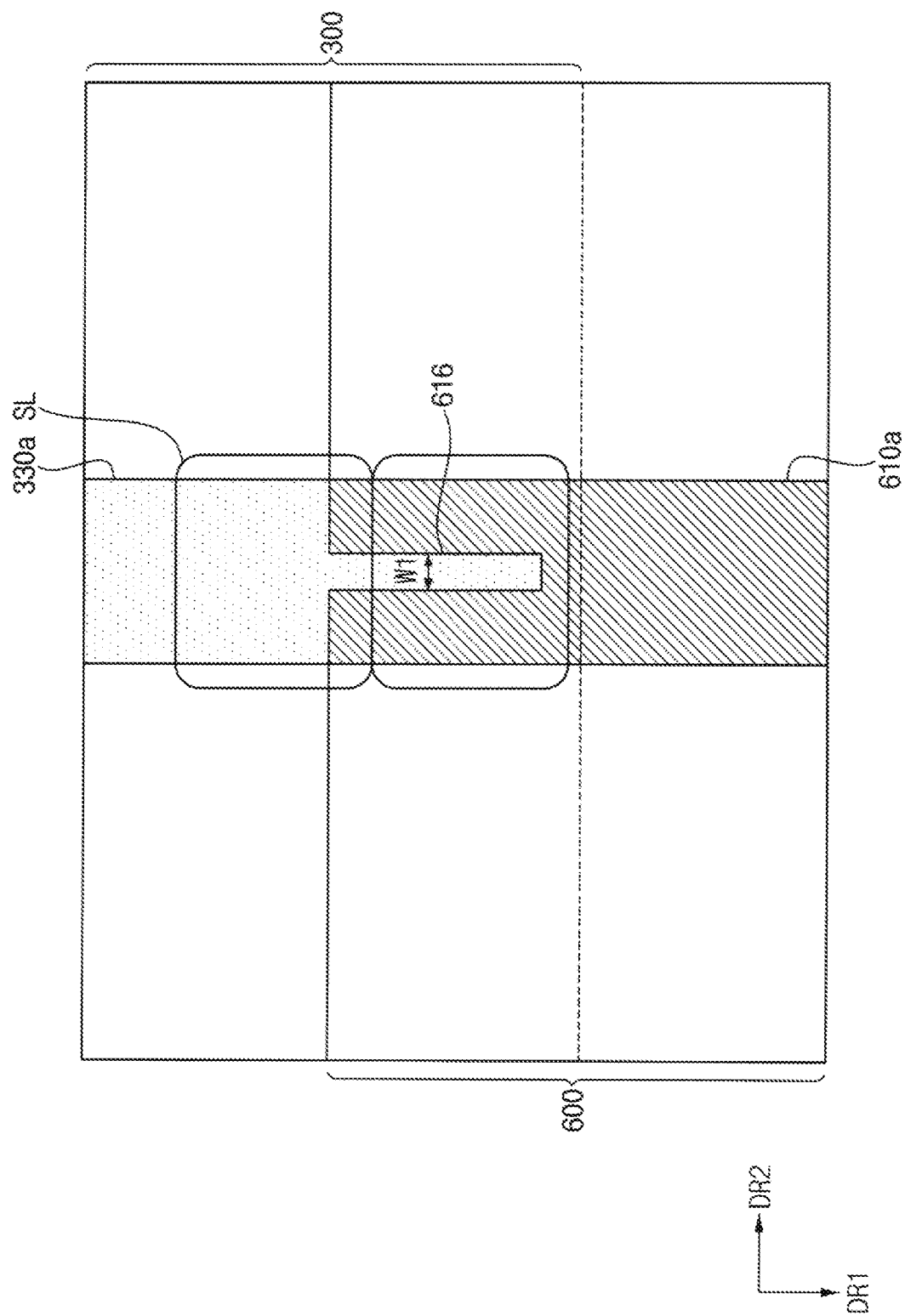

Referring to FIG. 18, a first circuit substrate 600 includes a slit 616 passing through at least a first transfer pad 610a and receiving at least a portion of a solder SL. The slit 616 may extend along a first direction DR1 and may have a uniform width such as of the first slit width W1. The first slit width W1 may be located along an entirety of the slit 616.

As explained in the above embodiments, a slit 616 receiving a solder may have various shapes.

In an embodiment, the slit structure may be applied for the first transfer pad 610a of the first circuit substrate 600. However, embodiments are not limited thereto. In an embodiment, for example, the slit structure may be applied for the second transfer pad 620a or for both of the first transfer pad 610a and the second transfer pad 620a.

Hereinafter, a pad design for reducing or preventing bonding failure due to misalignment of a first circuit substrate 600 and a digitizer 300 will be explained with reference to FIGS. 19 and 20.

In an embodiment, a width of a first transfer pad 610a of a first circuit substrate 600 and a width of a first connection pad 330a of a digitizer 300 may satisfy the following in equation.

$$Wc \leq [P-(Tt-Ta)]/2$$

$$Wd \geq [P+(Tt-Ta)]/2$$

In the above in equation, Wc is a transfer pad width of the first transfer pad 610a, Wd is a connection pad width of the first connection pad 330a, P is a pitch for pads (e.g., pad pitch), Ta is an alignment allowable difference (e.g., alignment tolerance), and Tt is a total difference equal to $Ta^2+Tb^2+Tc^2)^{1/2}$, where Tb is a pad manufacturing-induced difference (e.g., pad process tolerance) and Tc is a cutting-induced difference (e.g., alignment mark tolerance).

The alignment allowable difference Ta may be a maximum-allowable difference along a second direction DR2 in an alignment process. The alignment allowable difference Ta may be changed depending on an alignment apparatus, an alignment condition or the like. The pad manufacturing-induced difference Tb may be a maximum difference between a designed width of a pad and an actual width of a manufactured pad. The cutting-induced difference Tc may be a maximum difference between a designed distance and an actual distance which are taken between an alignment mark AM and an outer end (e.g., a cutting line) of the first circuit substrate 600.

For example, when the pitch P is 480 micrometers (μm), when the pitch P is same as a summation of the connection pad width Wd of the first connection pad 330a and the transfer pad width Wc of the first transfer pad 610a (P=Wd+Wc), and when the pad manufacturing-induced difference Tb is 0, the transfer pad width Wc of the first transfer pad may be equal to or less than about 214 μm, and the connection pad width Wd of the first connection pad may be equal to or more than about 266 μm so that the alignment allowable difference Ta may be about 70 μm and the cutting-induced difference Tc may be about 100 μM.

According to an embodiment, a pad may be designed to reduce or effectively prevent a bonding failure in view of misalignment factors such as an alignment allowable difference Ta, a pad manufacturing-induced difference Tb, a cutting-induced difference TC or the like.

In an embodiment, the above pad design may be applied for the first transfer pad 610a of the first circuit substrate 600 and the first connection pad 330a of the digitizer 300.

However, embodiments are not limited thereto. In an embodiment, for example, the pad design may be applied for the second transfer pad 620a of the first circuit substrate 600 and the second connection pad 340a of the digitizer 300. Furthermore, the pad design may be respectively applied for one or more of the first transfer pad 610a, the first transfer pad 610b, the second transfer pad 620a, the second transfer pad 620b, the first connection pad 330a, the first connection pad 330b, the second connection pad 340a and the second connection pad 340b.

Furthermore, the pad design may be applied for a transfer pad having a tapered shape as illustrated in FIG. 5. The pad design may include a width of the transfer pad which increases in a direction away from the distal end to define a tapered shape of the transfer pad in a plan view. In this case, the transfer pad width We in the equation may be a first width Wa of a distal end of the transfer pad.

Figure 19:
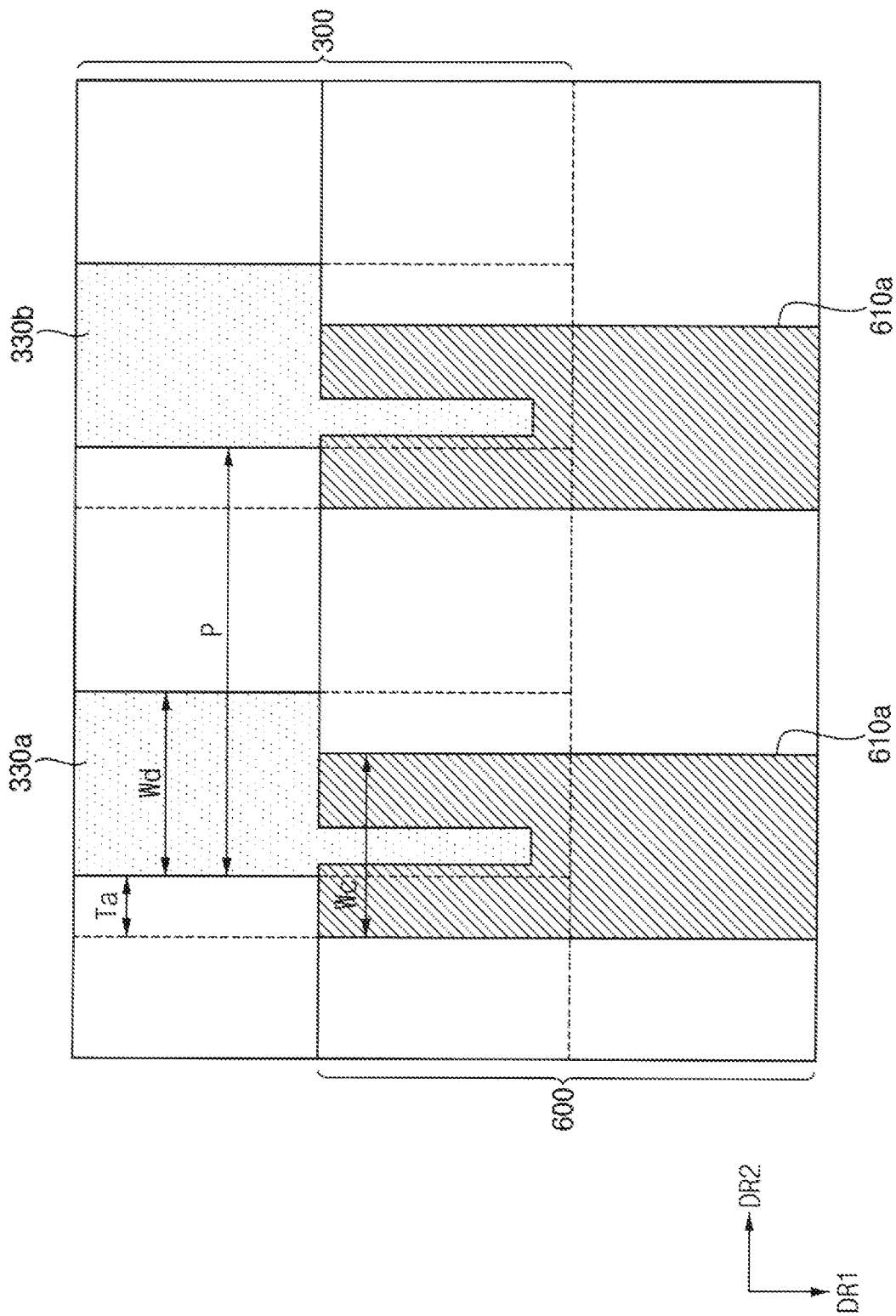
Figure 20:
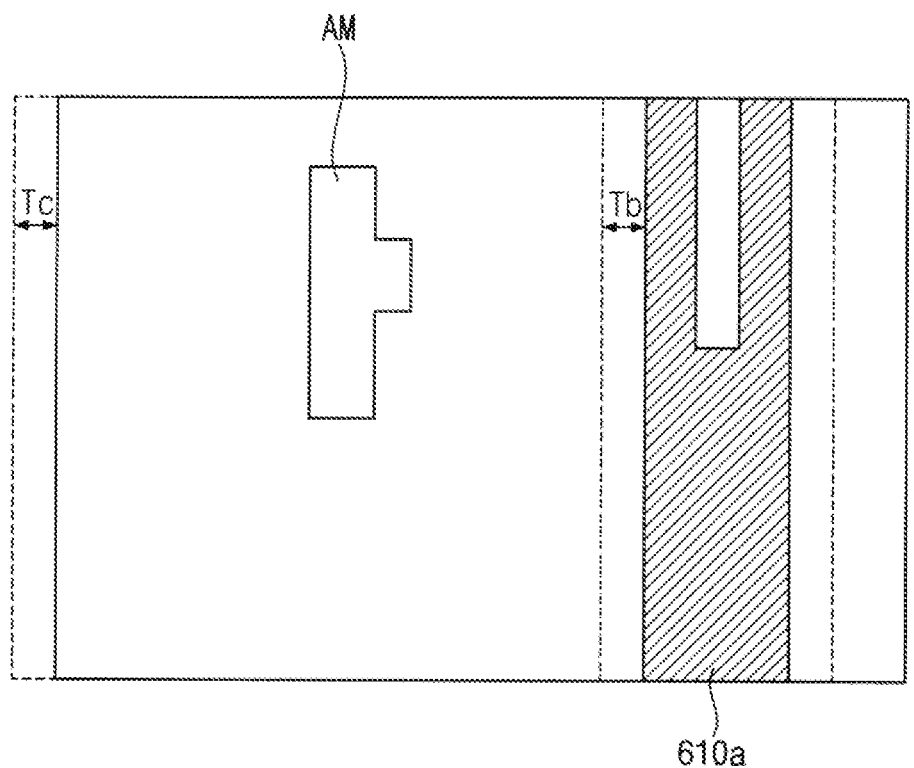
FIG. 20 is a plan view illustrating an embodiment of an alignment mark and a first transfer pad of a first circuit substrate of a display device.

Referring to FIGS. 19 and 20, an inner end of a slit 616 which is furthest from the outer end of the first circuit substrate 600 may have a sharp corner in an embodiment. However, embodiments are not limited thereto. In an embodiment, for example, the inner end of the slit 616 may have a round shape such as a half-circular shape, an arc shape or the like, or may have a round corner or a chamfered corner.

As explained in the above, one or more embodiment of a bonding structure may be used for connecting a digitizer 300 to a circuit substrate. However, embodiments are not limited thereto, and may include various bonding structures formed by a jet-soldering method for connecting various components of a display device 10 to each other.

Embodiments are not limited to a display device 10 including an organic light-emitting display panel. In an embodiment, for example, embodiments may include various display devices such as an inorganic electroluminescent display panel, a micro light-emitting diode ("LED") display panel or the like.

Embodiments may be used for forming a bonding structure for various electronic devices including a display device 10.

The foregoing is illustrative of embodiments and is not to be construed as limiting thereof. Although embodiments have been described, those skilled in the art will readily appreciate that many modifications are possible in the embodiments without materially departing from the novel teachings and aspects of the invention. Accordingly, all such modifications are intended to be included within the scope of the invention. Therefore, it is to be understood that the foregoing is illustrative of various embodiments and is not to be construed as limited to the specific embodiments disclosed, and that modifications to the disclosed embodiments, as well as other embodiments, are intended to be included within the scope of the invention, as set forth in the following claims and equivalents thereof.

What is claimed is:

1. A substrate conductive bonding structure, comprising:
a lower substrate including an end, and a connection pad which is exposed to outside the lower substrate at the end thereof and includes an upper surface;

an upper substrate including:
  an end overlapping the end of the lower substrate,
  a transfer pad which overlaps the connection pad of the lower substrate, is exposed to outside the upper substrate at the end of the upper substrate and includes an upper surface which is furthest from the lower substrate, and
  a slit which is defined in the transfer pad, overlaps the connection pad of the lower substrate and is open at the upper surface of the transfer pad, the slit including in order from the end of the upper substrate:
    an extending portion which extends along a first direction and has a first slit width along a second direction crossing the first direction, and
    an expansion portion which is connected to the extending portion and has a second slit width along the second direction which is larger than the first slit width of the extending portion; and
  a solder contacting the upper surface of the connection pad, extending to the upper surface of the transfer pad and into the slit which is defined in the transfer pad.

2. The substrate conductive bonding structure of claim 1, wherein the expansion portion of the slit has a circular shape.

3. The substrate conductive bonding structure of claim 1, wherein the expansion portion of the slit has a polygonal shape.

4. The substrate conductive bonding structure of claim 1, wherein the slit includes the expansion portion provided in plural including a plurality of expansion portions arranged along the first direction.

5. The substrate conductive bonding structure of claim 1, wherein
  the transfer pad includes a distal end which is closest to the end of the upper substrate, and
  the extending portion is spaced apart from the distal end of the transfer pad.

6. The substrate conductive bonding structure of claim 1, wherein the upper substrate further includes in order toward the lower substrate:
  the transfer pad;
  a supporting substrate; and
  a lower contact pad connected to the transfer pad and exposed to outside the upper substrate at the end of the upper substrate.

7. The substrate conductive bonding structure of claim 6, wherein
  within the upper substrate the slit which is open at the upper surface of the transfer pad passes through the transfer pad and the supporting substrate and exposes the lower contact pad to outside the upper substrate, and
  the solder which extends into the slit contacts the lower contact pad which is exposed to outside the upper substrate by the slit.

8. The substrate conductive bonding structure of claim 6, wherein
  within the upper substrate the slit which is open at the upper surface of the transfer pad exposes an upper surface of the supporting substrate to outside the upper substrate, and
  the solder which extends into the slit contacts the upper surface of the supporting substrate which is exposed to outside the upper substrate by the slit.

9. A substrate conductive bonding structure, comprising:
  a lower substrate including an end, and a connection pad which is exposed to outside the lower substrate at the end thereof, includes an upper surface and has a width;
  an upper substrate including:
    an end overlapping the end of the lower substrate,
    a transfer pad which overlaps the connection pad, is exposed to outside the upper substrate at the end of the upper substrate, includes an upper surface which is furthest from the lower substrate, and has a distal end which is closest to the end of the upper substrate,
    a width of the transfer pad which increases in a direction away from the distal end to define a tapered shape of the transfer pad in a plan view, and
    a first width at the distal end of the transfer pad which is smaller than the width of the connection pad; and
  a solder contacting the upper surface of the connection pad and extending to the upper surface of the transfer pad.

10. The substrate conductive bonding structure of claim 9, wherein the upper substrate further includes in order toward the lower substrate:
  the transfer pad;
  a supporting substrate; and
  a lower contact pad which is exposed to outside the upper substrate at the end of the upper substrate, is electrically connected to the transfer pad and forms an interface with the connection pad of the lower substrate.

11. A display device comprising:
  a display panel;
  a digitizer facing the display panel, the digitizer including:
    a first wiring extending along a first direction,
    an inner sidewall defining a sensor opening in the digitizer; and
    the first wiring defining a first connection pad which is exposed to outside the digitizer at the inner sidewall;
  a sensor in the opening;
  a connection substrate facing the display panel with both the digitizer and the sensor therebetween, covering the sensor which is in the sensor opening and electrically connected to the digitizer, the connection substrate including:
    a first transfer pad which is exposed to outside the connection substrate and connected to the digitizer at the first connection pad, and
    a slit which is defined in the first transfer pad, overlaps the first connection pad of the digitizer and is open in a direction away from the digitizer, the slit including in order toward the sensor opening:
      an extending portion which extends along the first direction and has a first slit width along a second direction crossing the first direction, and
      an expansion portion which is connected to the extending portion and has a second slit width along the second direction which is larger than the first slit width of the extending portion; and
  a first solder contacting the first connection pad of the digitizer, extending to the first transfer pad of the connection substrate and into the slit which is defined in the first transfer pad to bond the digitizer to the connection substrate.

12. The display device of claim 11, wherein the expansion portion of the slit which is defined in the first transfer pad of the connection substrate has a circular shape.

13. The display device of claim 11, wherein the expansion portion of the slit which is defined in the first transfer pad of the connection substrate has a polygonal shape.

14. The display device of claim 11, wherein the slit includes the expansion portion provided in plural including a plurality of expansion portions arranged along the first direction.

15. The display device of claim 11, wherein
the first transfer pad of the connection substrate includes a distal end which is furthest from the sensor opening, and
the extending portion of the slit which is defined in the first transfer pad of the connection substrate is spaced apart from the distal end of the first transfer pad.

16. The display device of claim 11, wherein the connection substrate further includes in order toward the digitizer:
the first transfer pad;
a supporting substrate; and
a lower contact pad connected to the first transfer pad and exposed to outside the connection substrate.

17. The display device of claim 16, wherein
within the connection substrate the slit passes through the first transfer pad and the supporting substrate and exposes the lower contact pad to outside the connection substrate, and
the first solder which extends into the slit contacts the lower contact pad which is exposed to outside the connection substrate.

18. The display device of claim 16, wherein
within the connection substrate the slit exposes an upper surface of the supporting substrate to outside the connection substrate, and
the first solder which extends into the slit contacts the upper surface of the supporting substrate which is exposed to outside the connection substrate.

19. The display device of claim 11, wherein
the digitizer further includes:
a second wiring which extends along the second direction, and
the second wiring defining a second connection pad which is exposed to outside the digitizer at the inner sidewall thereof,
the connection substrate further includes a second transfer pad which is exposed to outside the connection substrate and connected to the digitizer at the second connection pad, and
a second solder contacting the second connection pad of the digitizer and extending to the second transfer pad of the connection substrate to bond the digitizer to the connection substrate.

20. The display device of claim 11, wherein within the connection substrate:
the first transfer pad is provided in plural including a plurality of first transfer pads arranged along the second direction, and
the second transfer pad is provided in plural including a plurality of second transfer pads arranged along the first direction.

* * * * *